United States Patent
Kato et al.

(10) Patent No.: US 8,411,183 B2
(45) Date of Patent: Apr. 2, 2013

(54) SOLID-STATE IMAGING DEVICE AND DRIVING METHOD AS WELL AS ELECTRONIC APPARTUS

(75) Inventors: Akihiko Kato, Tokyo (JP); Yusuke Oike, Kanagawa (JP)

(73) Assignee: Sony Corporation, Tokyo (JP)

( * ) Notice: Subject to any disclaimer, the term of this patent is extended or adjusted under 35 U.S.C. 154(b) by 202 days.

(21) Appl. No.: 13/064,371

(22) Filed: Mar. 22, 2011

(65) Prior Publication Data

US 2011/0242379 A1    Oct. 6, 2011

(30) Foreign Application Priority Data

Mar. 31, 2010  (JP) ................. P2010-080527

(51) Int. Cl.
- *H04N 3/14* (2006.01)
- *H04N 5/335* (2006.01)
- *H01J 40/00* (2006.01)
- *C12Q 1/68* (2006.01)

(52) U.S. Cl. .............. 348/302; 348/294; 250/200

(58) Field of Classification Search .............. 348/294, 348/302–310; 250/200, 552, 553, 559.01–559.49
See application file for complete search history.

(56) References Cited

U.S. PATENT DOCUMENTS

| | | | | |
|---|---|---|---|---|
| 5,299,013 | A  * | 3/1994 | Wang et al. | 348/307 |
| 5,668,597 | A  * | 9/1997 | Parulski et al. | 348/350 |
| 5,818,526 | A  * | 10/1998 | Nomoto | 348/302 |
| 6,163,386 | A  * | 12/2000 | Kobayashi et al. | 358/482 |
| 6,795,121 | B2 * | 9/2004 | Matsunaga et al. | 348/308 |
| 7,489,353 | B2 * | 2/2009 | Funakoshi | 348/296 |
| 2001/0013901 | A1* | 8/2001 | Matsunaga et al. | 348/308 |
| 2002/0149688 | A9* | 10/2002 | Matsunaga et al. | 348/308 |
| 2004/0130757 | A1 | 7/2004 | Mabuchi | |
| 2008/0198250 | A1* | 8/2008 | Suzuki | 348/294 |
| 2010/0283881 | A1* | 11/2010 | Araki et al. | 348/308 |
| 2011/0205419 | A1* | 8/2011 | Fujita et al. | 348/308 |

FOREIGN PATENT DOCUMENTS

JP  2004-140149  5/2004

* cited by examiner

*Primary Examiner* — Lin Ye
*Assistant Examiner* — Chia-Wei A Chen
(74) *Attorney, Agent, or Firm* — Rader, Fishman & Grauer PLLC

(57) ABSTRACT

A solid-state imaging device includes: a CMOS image sensor including a plurality of pixels disposed in an array and each including a light reception element, a discharging unit, a charge accumulation section, a transfer unit, a reset unit, an amplification unit, and a selection unit; and a control unit adapted to generate a selection pulse for rendering the selection unit operative to control operation of the CMOS image sensor.

15 Claims, 24 Drawing Sheets

SOLID-STATE IMAGING DEVICE AND DRIVING METHOD AS WELL AS ELECTRONIC APPARTUS

BACKGROUND OF THE INVENTION

1. Field of the Invention

This invention relates to a solid-state imaging device and a driving method for a solid-state imaging device as well as an electronic apparatus, and more particular to a technique for reducing generation of noise in a solid-state imaging device and a driving method for a solid-state imaging device as well as an electronic apparatus.

2. Description of the Related Art

A popular image sensor of the CMOS (Complementary Metal Oxide Semiconductor) type includes a mechanism for sequentially scanning a pixel array, in which pixels are arrayed two-dimensionally, for each pixel row to carry out reading out. This row-sequential scanning generates a displacement in time among accumulation periods with regard to different pixel rows and gives rise to occurrence of a phenomenon called focal plane distortion that a picked up image upon imaging of a moving imaging object is distorted.

In imaging applications to an imaging object moving at a high speed which cannot permit such image distortion or in sensing applications which require simultaneity of picked up images, some CMOS image sensor carries out driving for establishing simultaneity of the accumulation periods of the pixel array. In particular, for the driving described, accumulation over an overall area of the pixel array is started simultaneously by simultaneous resetting driving for all rows of photodiodes (PD) in the pixel array. Then, the accumulation over the overall area is ended by simultaneous transfer driving for all rows to charge accumulation sections such as floating diffusions (FD).

Among such CMOS image sensors, a CMOS image sensor is known and disclosed, for example, in Japanese Patent Laid-Open No. 2004-140149 (hereinafter referred to as Patent Document 1) wherein, in order to provide a degree of freedom in time between a row-sequential reading out period and an exposure period, a simultaneous charge discharging unit or overflow gate is provided for a photodiode (PD). The CMOS image sensor of the Patent Document 1 mentioned above carries out an operation of opening the overflow gates simultaneously for all rows to discharge charge of the photodiodes intermediately within a row-sequential reading out period. The CMOS image sensor further carries out another operation of stopping the discharging operation at a point of time of a predetermined row, that is, keeping the overflow gates closed simultaneously to start exposure of the photodiodes simultaneously and then continue the exposure. Then, at the top of a next frame period, the exposure is ended by simultaneous transfer driving for all rows to the charge accumulation sections such as floating diffusions to carry out sequential reading out operation of the signals of the photodiodes. By the sequence of operations, starting of the exposure period can be set to a free row timing including a period for sequential reading out in a unit of a row to achieve improvement of the degree of freedom in exposure time.

SUMMARY OF THE INVENTION

Incidentally, at a transition timing of a signal for simultaneous driving of the overflow gates described above, a charging operation and a discharging operation are carried out over an overall circuit including the wiring line capacitance, gate capacitance and so forth over the overall area of a pixel. Therefore, a bad influence is had on reading of a signal such that an IR drop of a power supply line occurs or a different signal line is influenced by coupling by transition of a signal over the overall area of the pixel. Further, within a period of time at a transition timing, many capacitance loads are driven. Therefore, the period of time becomes comparatively long such as several microseconds in comparison with the other operations.

Generally, such simultaneous driving of the overflow gates is not carried out within a period within which an analog signal is read out from the pixels and A/D (analog/digital) converted from within a row period which is an operation timing of the sensor thereby to minimize a bad influence thereof.

Operation of a sensor within a row period is, for example, such as illustrated at a left portion in FIG. 1. In particular, referring to FIG. 1, within a period from time t1 to time t2, reading out from pixels and an A/D conversion process are executed. Then within another period from time t2 to time t3, the signals are outputted to the outside by a horizontal transferring operation. Then, a later period from time t3 to time t4 becomes an idle period within which nothing is carried out. The idle period appears because the row period is determined from a factor of a system such as a video timing.

Simultaneous driving of the overflow gates is preferably allocated to the idle period within which nothing is carried out, particularly within the period from time t3 to time t4 or to the horizontal scanning period from time t2 to time t3. On the other hand, in a different sensor wherein A/D conversion is not carried out upon reading out as seen from a period from time t11 to time t12 at a right portion in FIG. 1 but is carried out during horizontal transfer within a period from time t12 to time t13, simultaneous driving of the overflow gates is preferably carried out within the idle period within which nothing is carried out as seen from a period from time t13 to time t14.

However, in a video signal in recent years, increase of the number of pixels and the frame rate has been and is advancing, and the row period tends to become short. For example, in high definition television standards for imaging and displaying a dynamic picture formed from an image of 1,920 pixels horizontally and 1,080 pixels vertically at a frame rate of 1/60 second, the row period is 7.6 microseconds. Thus, the rate at which the overflow gate driving occupies in the transition is high, and the period which can be secured is very short.

A solid-state imaging apparatus which is ready for high speed operation is disclosed in Japanese Patent Laid-Open No. 2010-22063 wherein reading out and A/D conversion operations and horizontal transfer are carried out like pipeline processing to achieve speeding up of operation. In this instance, it is possible to allocate reading out from the pixels and A/D conversion to the overall range of a row period as seen from a period from time t31 to time t32 and another period from time t31 to time t33 of FIG. 2. Further, as seen from a further period from time t33 to time t34, an idle period within which nothing is carried out as a period for overflow gate driving having no bad influence on reading out can be made a limited or short period as a period which can be secured.

Therefore, it is desirable to provide a solid-state imaging device and a driving method for a solid-state imaging device as well as an electronic apparatus wherein simultaneous driving of overflow gates is carried out upon sequential reading out operation such that, while an accumulation period having high simultaneity in degree of freedom in time is provided, a bad influence of the simultaneous driving is minimized thereby to reduce noise included in a picked up image.

According to an embodiment of the present invention, there is provided a solid-state imaging device including a CMOS image sensor including a plurality of pixels disposed in an array and each including a light reception element adapted to receive light to generate charge as a reception light signal, a discharging unit adapted to discharge the charge as the reception light signal of the light reception element, a charge accumulation section adapted to accumulate the charge as the reception light signal of the light reception element transferred thereto, a transfer unit adapted to transfer the charge as the reception light signal to the charge accumulation section through a different route different from a route along which the charge as the reception light signal is discharged by the discharging unit, a reset unit adapted to release the charge accumulated in the charge accumulation section to reset the charge accumulation section, an amplification unit adapted to amplify and output the reception light signal accumulated in the charge accumulation section, and a selection unit adapted to select an output of the amplification unit, and a control unit adapted to generate a selection pulse for rendering the selection unit operative to control operation of the CMOS image sensor. Charge as reception light signals accumulated in the light reception elements in a frame or frames preceding to a current frame is transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharging units, the reception light signals accumulated in the charge accumulation sections are amplified successively in a unit of a row by the amplification units and then read out. The discharging of the charge as the reception light signals of the light reception elements by the discharging units is stopped, whereafter accumulation of charge as reception light signals by the light reception elements is started. The charge accumulated in the charge accumulation sections is discharged, at a top of a current frame which is next to a frame with regard to which the reading out by the selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by the transfer unit. The reception light signals accumulated in the charge accumulation sections are amplified and read out, in a state in which the charge accumulated in the light reception elements continues to be discharged simultaneously in a unit of a row by the discharging units again, successively in a unit of a row by the amplification units. The control unit controls, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

The solid-state imaging device may be configured such that the CMOS image sensor further includes a predetermined number of dummy rows which in turn include pixels which do not contribute to the image display, and the control unit controls so as to generate, when the reception light signals accumulated in the charge accumulation sections are successively amplified by the amplification units and read out by the selection units in a unit of a row, a selection pulse for causing the selection units of the pixels of the predetermined number of dummy rows which do not contribute to the image display from among the pixels to operate at a timing at which the discharging of the charge accumulated in the light reception elements by the discharging units is stopped.

Or, the solid-state imaging device may be configured such that the control unit controls so as to generate, when the reception light signals accumulated in the charge accumulation sections are successively amplified by the amplification units and read out by the selection units in a unit of a row, a selection pulse for causing the selection units of those pixels in a row, with regard to which the reception light signals accumulated in the charge accumulation sections are amplified by the amplification units and read out already by the selection units, from among the pixels to operate at a timing at which the discharging of the charge accumulated in the light reception elements by the discharging units is stopped.

Each of the pixels of the CMOS image sensor may further include a different charge accumulation section different from the charge accumulation section and formed from a charge retaining region disposed between the light reception element and the charge accumulation section which is formed from a floating diffusion region.

The solid-state imaging device may further include a row unit image information storage unit adapted to successively store image signals at least for one row formed by amplification of the reception light signals by the amplification units and outputted by the selection units, and a selection unit adapted to decide whether or not the image signals for at least one row formed by amplification of the reception light signals by the amplification units and outputted by the selection units are image signals of those pixels in a row which does not contribute to the image display, select and output, when the image signals for one row outputted by the selection units are not image signals of the pixels in a row which does not contribute to the image display, image signals in one immediately preceding row stored in the row unit image information storage unit but select and output, when the image signals for one row outputted by the selection units are image signals of the pixels in a row which does not contribute to the image display, image signals for one immediately preceding row stored in the row unit image information storage unit, and select and output, with regard to a succeeding row, image signals for one row outputted by the selection units.

The CMOS image sensor may be configured such that one or plural ones of the charge accumulation section, transfer unit, reset unit, amplification unit and selection unit are commonly used by plural ones of the pixels.

The solid-state imaging device may further include a digital signal processor provided on a main body substrate.

According to another embodiment of the present invention, there is provided a driving method for a solid-state imaging device which includes a CMOS image sensor including a plurality of pixels disposed in an array and each including a light reception element adapted to receive light to generate charge as a reception light signal, a discharging unit adapted to discharge the charge as the reception light signal of the light reception element, a charge accumulation section adapted to accumulate the charge as the reception light signal of the light reception element transferred thereto, a transfer unit adapted to transfer the charge as the reception light signal to the charge accumulation section through a different route different from a route along which the charge as the reception light signal is discharged by the discharging unit, a reset unit adapted to release the charge accumulated in the charge accumulation section to reset the charge accumulation section, an amplification unit adapted to amplify and output the reception light signal accumulated in the charge accumulation section, and a selection unit adapted to select an output of the amplification unit, and a control unit adapted to generate a selection pulse for rendering the selection unit operative to control operation of the CMOS image sensor. The driving method includes a controlling step carried out by the control unit of generating a selection pulse for causing the selection means to operate to control operation of the selection unit. Charge as reception light signals accumulated in the light reception elements in a frame or frames preceding to a current frame is transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharging units, the reception light signals accumulated in the charge accumulation sections are amplified successively in a unit of a row by the amplification units and then read out. The discharging of the charge as the reception light signals of the light reception elements by the discharging units is stopped, whereafter accumulation of charge as reception light signals by the light reception elements is started. The charge accumulated in the charge accumulation sections is discharged, at a top of a current frame which is next to a frame with regard to which the reading out by the selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by the transfer unit. The reception light signals accumulated in the charge accumulation sections are amplified and read out, in a state in which the charge accumulated in the light reception elements continues to be discharged simultaneously in a unit of a row by the discharging units again, successively in a unit of a row by the amplification units. The processing at the controlling step controls, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

The driving method for solid-state imaging device may be configured such that the CMOS image sensor further includes a predetermined number of dummy rows which in turn include pixels which do not contribute to the image display, and the processing at the controlling step controls so as to generate, when the reception light signals accumulated in the charge accumulation sections are successively amplified by the amplification units and read out by the selection units in a unit of a row, a selection pulse for causing the selection units of the pixels of the predetermined number of dummy rows which do not contribute to the image display from among the pixels to operate at a timing at which the discharging of the charge accumulated in the light reception elements by the discharging units is stopped.

Or, the driving method for a solid-state imaging device may be configured such that the processing at the controlling step controls so as to generate, when the reception light signals accumulated in the charge accumulation sections are successively amplified by the amplification units and read out by the selection units in a unit of a row, a selection pulse for causing the selection units of those pixels in a row, with regard to which the reception light signals accumulated in the charge accumulation sections are amplified by the amplification units and read out already by the selection units, from among the pixels to operate at a timing at which the discharging of the charge accumulated in the light reception elements by the discharging units is stopped.

Each of the pixels of the CMOS image sensor may further include a different charge accumulation section different from the charge accumulation section and formed from a charge retaining region disposed between the light reception element and the charge accumulation section which is formed from a floating diffusion region.

The solid-state imaging device may further include a row unit image information storage unit adapted to successively store image signals at least for one row formed by amplification of the reception light signals by the amplification units and outputted by the selection units, and a selection unit adapted to decide whether or not the image signals for at least one row formed by amplification of the reception light signals by the amplification units and outputted by the selection units are image signals of those pixels in a row which does not contribute to the image display, select and output, when the image signals for one row outputted by the selection units are not image signals of the pixels in a row which does not contribute to the image display, image signals in one immediately preceding row stored in the row unit image information storage unit but select and output, when the image signals for one row outputted by the selection units are image signals of the pixels in a row which does not contribute to the image display, image signals for one immediately preceding row stored in the row unit image information storage unit, and select and output, with regard to a succeeding row, image signals for one row outputted by the selection units.

The CMOS image sensor may be configured such that one or plural ones of the charge accumulation section, transfer unit, reset unit, amplification unit and selection unit are commonly used by plural ones of the pixels.

The solid-state imaging device may further include a digital signal processor provided on a main body substrate.

According to a further embodiment of the present invention, there is provided an electronic apparatus including a CMOS image sensor including a plurality of pixels disposed in an array and each including a light reception element adapted to receive light to generate charge as a reception light signal, a discharging unit adapted to discharge the charge as the reception light signal of the light reception element, a charge accumulation section adapted to accumulate the charge as the reception light signal of the light reception element transferred thereto, a transfer unit adapted to transfer the charge as the reception light signal to the charge accumulation section through a different route different from a route along which the charge as the reception light signal is discharged by the discharging unit, a reset unit adapted to release the charge accumulated in the charge accumulation section to reset the charge accumulation section, an amplification unit adapted to amplify and output the reception light signal accumulated in the charge accumulation section, and a selection unit adapted to select an output of the amplification unit, and a control unit adapted to generate a selection pulse for rendering the selection unit operative to control operation of the CMOS image sensor. Charge as reception light signals accumulated in the light reception elements in a frame or frames preceding to a current frame is transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharging units, the reception light signals accumulated in the charge accumulation sections are amplified successively in a unit of a row by the amplification units and then read out. The discharging of the charge as the reception light signals of the light reception elements by the discharging units is stopped, whereafter accumulation of charge as reception light signals by the light reception elements is started. The charge accumulated in the charge accumulation sections being discharged, at a top of a current frame which is next to a frame with regard to which the reading out by the selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by the transfer unit. The reception light signals accumulated in the charge accumulation sections are amplified and read out, in a state in which the charge accumulated in the light reception elements continues to be discharged simultaneously in a unit of a row by the discharging units again, successively in a unit of a row by the amplification units. The control unit controls, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

In the solid-state imaging device and the driving method for a solid-state imaging device as well as the electronic apparatus, when each of the light reception elements of the CMOS image sensor including the pixels disposed in an array receives light, charge is generated as a reception light signal. The charge as the reception light signal of the light reception element is discharged by the discharging unit. The charge as the reception light signal of the light reception element transferred from the discharging unit is accumulated by the charge accumulation section. The charge as the reception light signal is transferred to the charge accumulation section through the different route different from the route along which the charge as the reception light signal is discharged by the discharging unit. The reception light signal accumulated in the charge accumulation section is released to reset the charge accumulation section. The reception light signal accumulated in the charge accumulation section is amplified and outputted by the amplification unit. The output of the amplification unit is selected by the selection unit. A selection pulse for rendering the selection unit operative is generated to control operation of the CMOS image sensor. Charge as reception light signals accumulated in the light reception elements in a frame or frames preceding to a current frame is transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharging units, the reception light signals accumulated in the charge accumulation sections are amplified successively in a unit of a row by the amplification units and then read out. The discharging of the charge as the reception light signals of the light reception elements by the discharging units is stopped, whereafter accumulation of charge as reception light signals by the light reception elements is started. The charge accumulated in the charge accumulation sections is discharged, at a top of a current frame which is next to a frame with regard to which the reading out by the selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by the transfer unit. The reception light signals accumulated in the charge accumulation sections are amplified and read out, in a state in which the charge accumulated in the light reception elements continues to be discharged simultaneously in a unit of a row by the discharging units again, successively in a unit of a row by the amplification units. The control unit controls, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

The solid-state imaging device may be an independent device or may be a block for carrying out a driving controlling process for a solid-state imaging apparatus.

With the solid-state imaging device and the driving method for a solid-state imaging device as well as the electronic apparatus, simultaneous driving of overflow gates can be carried out upon sequential reading out operation such that, while an accumulation period having high simultaneity in degree of freedom in time is provided, a bad influence of the simultaneous driving is minimized thereby to reduce noise included in a picked up image.

In summary, with the solid-state imaging device and the driving method for a solid-state imaging device as well as the electronic apparatus, when an image is picked up using the image sensor, generation of noise can be reduced.

DETAILED DESCRIPTION OF THE PREFERRED EMBODIMENTS

In the following, preferred embodiments of the present invention are described with reference to the accompanying drawings. It is to be noted that the description is given in the following order:
1. First Embodiment (example of a configuration wherein a dummy row is provided)
2. Second Embodiment (example of a configuration wherein no dummy row is provided)
3. Third Embodiment (example of a configuration wherein a selector is provided)
4. Fourth Embodiment (other examples of a configuration of a unit pixel)
5. Fifth Embodiment (example of a configuration of an electronic apparatus which includes a CMOS sensor formed using a solid-state imaging device according to the present invention)<
<1. First Embodiment>
Example of a Configuration of a Solid-State Imaging Device FIG. 3 is a block diagram showing an example of a configuration of a CMOS image sensor as a solid-state imaging device to which the present invention is applied.

Figure 3:
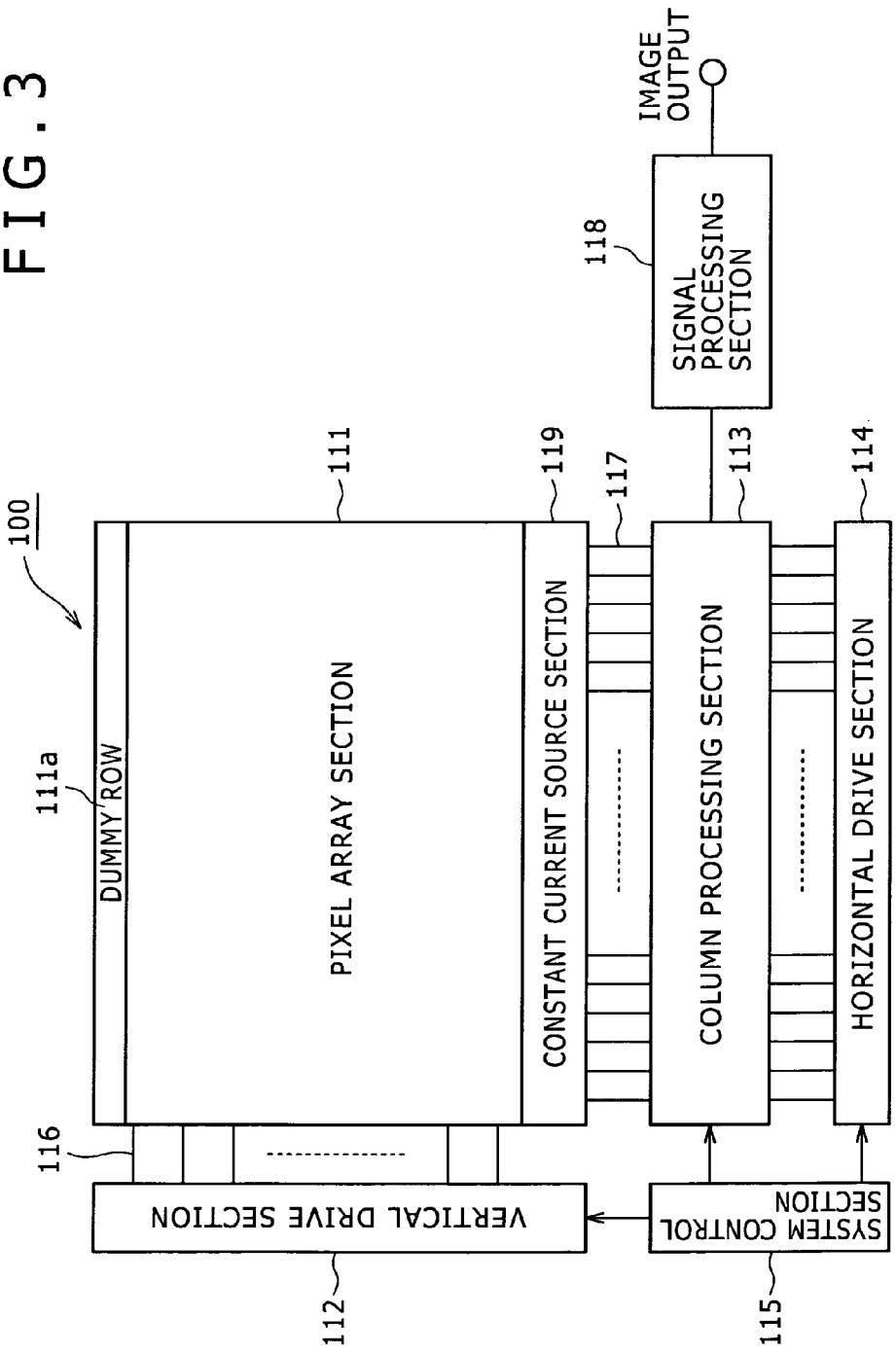
FIG. 3 is a block diagram showing an example of a configuration of a CMOS image sensor according to a first embodiment of the present invention to which a solid-state image sensor of the present invention is applied.

Referring to FIG. 3, the CMOS image sensor 100 shown includes a pixel array section 111, a vertical drive section 112, a column processing section 113, a horizontal drive section 114, and a system control section 115. The pixel array section 111, vertical drive section 112, column processing section 113, horizontal drive section 114 and system control section 115 are formed on a semiconductor substrate or chip not shown. A constant current supply section 119 is provided on the pixel array section 111.

The pixel array section 111 includes a plurality of unit pixels disposed two-dimensionally in a matrix, that is, in rows and columns. Each of the unit pixels includes a photoelectric conversion element for generating photocharge of a charge amount in accordance with an amount of incident light thereto as a reception light signal and accumulates the photocharge therein. It is to be noted that, in the following description, photocharge of a charge amount in accordance with an incident light amount is sometimes referred to merely as "charge," and a unit pixel is sometimes referred to merely as "pixel."

Figure 1:
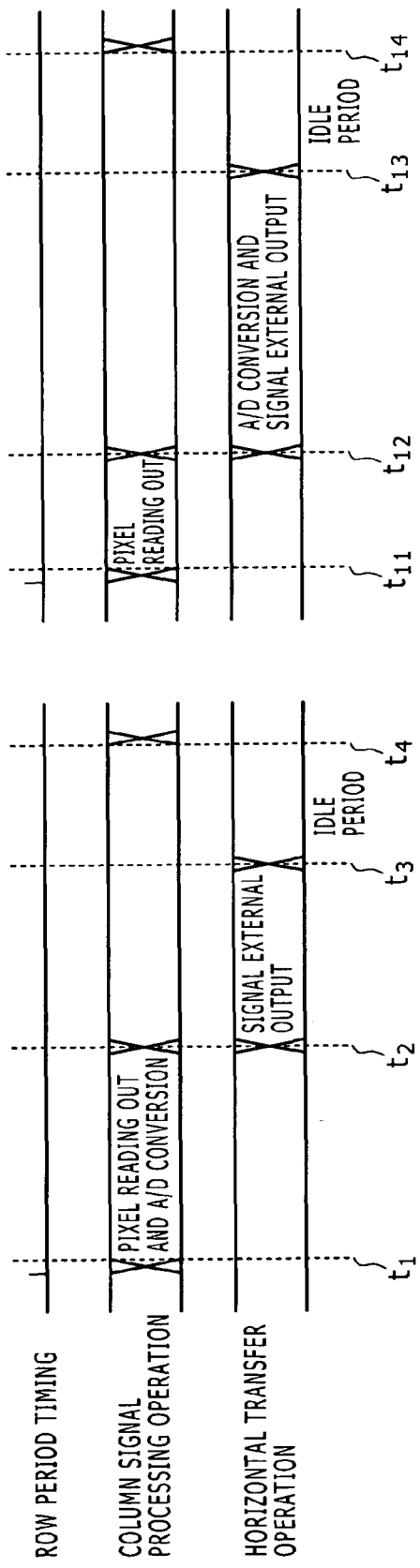
FIGS. 1 and 2 are diagrammatic views illustrating operation of different related-art CMOS image sensors.

The pixel array section 111 further includes a plurality of pixel drive lines 116 formed along a leftward and rightward direction in FIG. 1, that is, in an array direction of the pixels in a pixel row, for the individual rows of the pixel array in the matrix. Further, the pixel array section 111 includes a plurality of vertical signal lines 117 formed along an upward and downward direction, that is, in an array direction of the pixels in a pixel column, for the individual columns of the pixel array in the matrix. Although each of the pixel drive lines 116 is shown as a single line in FIG. 3, the number of lines in each pixel drive line 116 is not limited to one. Each of the pixel drive lines 116 is connected at one terminal thereof to one of output terminals of the vertical drive section 112 which individually correspond to the rows. Further, the pixel array section 111 includes a dummy row 111a formed from pixels which does not contribute to image display separately from the pixels which contribute to image display.

The CMOS image sensor 100 further includes a signal processing section 118. The signal processing section 118 may be an external signal processing section such as, for example, a DSP (Digital Signal Processor) provided on a substrate separate from the substrate of the CMOS image sensor 100 or may be implemented processing by software. Naturally, however, the signal processing section 118 may be mounted on the substrate on which the CMOS image sensor 100 is mounted.

The vertical drive section 112 is configured from a shift register, an address decoder or the like and serves as a pixel driving section which drives all of the pixels of the pixel array section 111 simultaneously or drives the pixels in a unit of a row or the like. While a particular configuration of the vertical drive section 112 is not specifically disclosed herein, it generally has a configuration which includes two scanning systems including a reading out scanning system and a sweeping out scanning system.

The reading out scanning system selectively and successively scans the unit pixels of the pixel array section 111 in a unit of a row in order to read out signals from the unit pixels. The sweeping out scanning system carries out sweeping scanning preceding by a period of time of a shutter operation to reading out scanning for a reading out row for which the reading out scanning is to be carried out by the reading out scanning system.

By the sweeping out scanning by the sweeping out scanning system, unnecessary charge is swept out from the photoelectric conversion element of the unit pixels of the reading out row thereby to reset the photoelectric conversion elements. Then, by sweeping out unnecessary charge by means of the sweeping out scanning system, that is, by resetting the photoelectric conversion elements, electronic shutter operation is carried out. The electronic shutter operation is an operation of discharging photocharge of the photoelectric conversion elements to newly start exposure to light, that is, an operation of starting accumulation of photocharge.

Signals read out by the reading out operation by the reading out scanning system correspond to amounts of light received after the immediately preceding reading out operation or electronic shutter operation. Then, a period after the reading out timing by the immediately preceding reading out operation or the sweeping out timing by the electronic shutter operation till the reading out timing by the reading out operation in the current cycle becomes an accumulation period or exposure period of photocharge in or to the pixels 11.

A pixel signal outputted from each of the unit pixels of a pixel row selectively scanned by the vertical drive section 112 is supplied to the column processing section 113 through the constant current supply section 119 and a vertical signal line 117. The constant current supply section 119 supplies bias current to the pixels and is disposed for the pixel columns. The column processing section 113 carries out predetermined signal processing for a pixel signal, that is, a reception light signal, outputted from each unit pixel of the selected row through a vertical signal line 117 for each pixel column of the pixel array section 111. Further, the column processing section 113 temporarily retains the image signal after the signal processing.

In particular, the column processing section 113 carries out at least a noise removal process such as, for example, a CDS (Correlated Double Sampling) process as the signal processing. By the CDS process by the column processing section 113, reset noise and fixed pattern noise unique to each pixel such as a threshold value dispersion of an amplification transistor are removed. It is possible to provide the column processing section 113, for example, with an AD (Analog-Digital) conversion function in addition to the noise removal processing function so that a signal level is outputted in the form of a digital signal. Further, the column processing section 113 stores a reception light signal of a signal level read out and a reception light signal of a reset level, calculates a difference between the reception light signals and supplies the difference as a signal level to the signal processing section 118.

The horizontal drive section 114 is configured from a shift register, an address decoder or the like and successively selects the unit pixels corresponding to the pixel columns of the column processing section 113. By the selection scanning by the horizontal drive section 114, pixel signals processed by the column processing section 113 are successively outputted to the signal processing section 118.

The system control section 115 is configured from a timing generator or the like which generates various timing signals and carries out drive control of the vertical drive section 112, column processing section 113, horizontal drive section 114 and so forth based on the timing signals generated by the timing generator.

The signal processing section 118 carries out signal processing for information of reception light signals read out in a unit of a row and outputs resulting signals.

Figure 2:
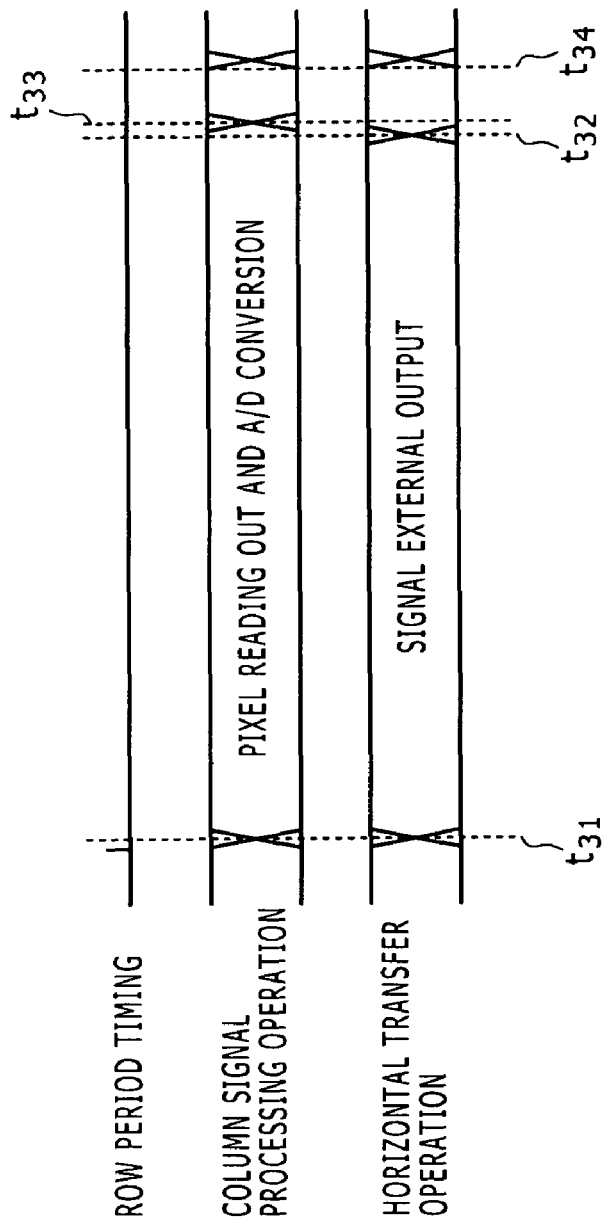

Example of a Circuit Configuration of the Unit Pixels of the CMOS Image Sensor 100 of FIG. 2

Now, an example of a unit pixel disposed in the pixel array section 111 shown in FIG. 3 is described with reference to FIGS. 4 and 5. It is to be noted that FIG. 4 shows a circuit configuration of a unit pixel 120 disposed in the pixel array section 111, and FIG. 5 shows a cross sectional configuration of the unit pixel 120.

Figure 4:
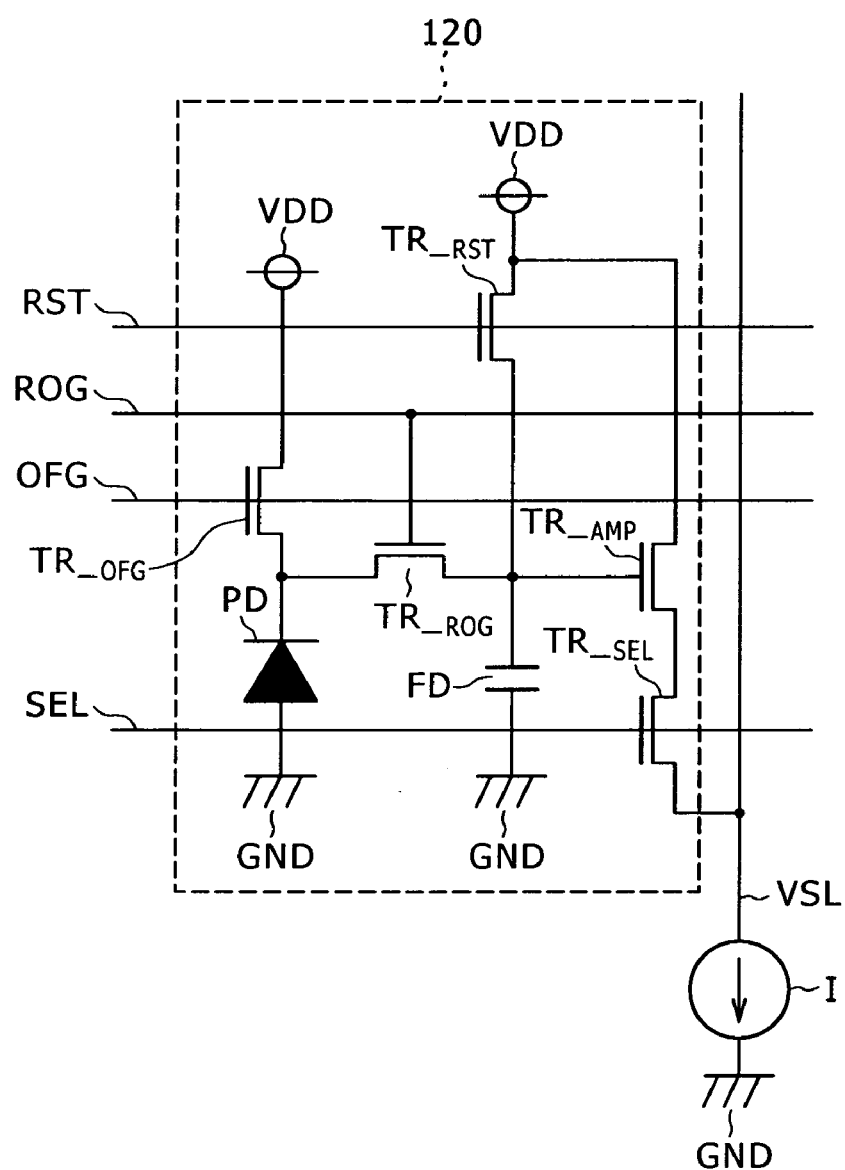
FIG. 4 is a circuit diagram showing an example of a configuration of a unit pixel in a pixel array section shown in FIG. 3.
Figure 5:
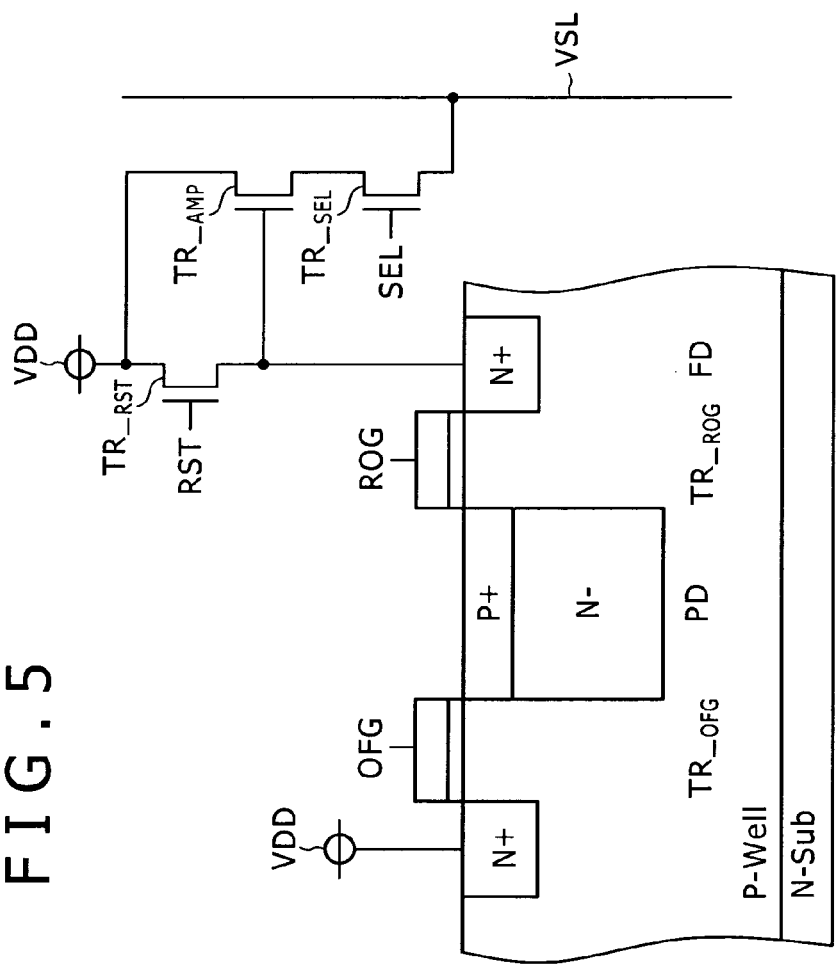
FIG. 5 is a side elevational sectional view showing an example of a configuration of a unit pixel in the pixel array section shown in FIG. 3.

A circuit configuration within a range defined by a broken line in FIG. 4 is an example of a circuit configuration of the unit pixel 120. The unit pixel 120 includes a photodiode PD, a discharge transistor TR_OFG, a reset transistor TR_RST, a transfer gate TR_ROG, a selection transistor TR_SEL and a floating diffusion region FD.

The photodiode PD which is a photoelectric conversion element is grounded at the anode electrode thereof and is connected at the cathode electrode thereof to the source of the transfer gate TR_ROG formed from a transistor. The photodiode PD is an embedded photodiode formed, for example, by embedding an N-type embedded layer N- in a P-type well layer P-Well formed on an N-type substrate N-sub by forming a P-type layer P+ on the surface side of the substrate as seen in FIG. 5.

The discharge transistor TR_OFG is connected at the gate electrode thereof to a discharge pulse line OFG and at the source electrode thereof to the cathode of the photodiode PD and the drain electrode of the transfer gate TR_ROG. Further, the discharge transistor TR_OFG is connected at the drain electrode thereof to a discharge drain line OFD. In particular, during accumulation of the photodiode PD, a discharge pulse OFG of a low level, that is, of the GND level, is generated through the discharge pulse line OFG to place the gate electrode of the discharge transistor TR_OFG into an off state so that no influence may be had on the accumulation operation. Further, after charge as a reception light signal of the photodiode PD is transferred to the floating diffusion region FD simultaneously with regard to all pixels, a discharge pulse OFG of a high level is generated through the discharge pulse line OFG, and the discharge transistor TR_OFG is placed into an on state. Consequently, the photodiode PD and the discharge drain line OFD are connected to each other to discharge charge remaining in the photodiode PD. In particular, when a discharge pulse OFG is applied to the gate electrode of the discharge transistor TR_OFG, from which a leader line denoted by "OFG" in FIG. 5 is drawn, upon starting of exposure, charge of the photodiode PD is discharged to the discharge drain line OFD of the N type layer denoted by "N+" at a left portion in FIG. 5. The discharge transistor TR_OFG further acts to prevent the photodiode PD from being saturated to allow charge to overflow from the photodiode PD during a reading out period after an end of exposure. To the discharge drain line OFD, a predetermined voltage VDD is applied.

The transfer gate TR_ROG is connected at the drain electrode thereof to the anode of the photodiode PD and the source electrode of the discharge transistor TR_OFG and at the source electrode thereof to the floating diffusion region FD, the gate electrode of an amplification transistor TR_AMP and the source electrode of the reset transistor. TR_RST. Further, the transfer gate TR_ROG is connected at the gate electrode thereof to a transfer pulse line ROG. In particular, if a transfer pulse ROG is supplied through the transfer pulse line ROG under the control of the system control section 115 of FIG. 3, then the transfer gate TR_ROG transfers charge accumulated by photoelectric conversion by the photodiode PD to the floating diffusion region FD. In particular, the transfer gate TR_ROG transfers charge accumulated in the photodiode PD to the floating diffusion region FD when the transfer pulse ROG is applied to the gate electrode of the transfer gate TR_ROG, from which a leader line denoted by "ROG" is drawn in FIG. 5.

The floating diffusion region FD is a charge voltage conversion section formed from the N-type layer N+ (N+ at a right portion in FIG. 5) and temporarily retains charge photoelectrically converted by and accumulated in the photodiode PD and transferred thereto from the transfer gate TR_ROG. Then, the floating diffusion region FD converts the temporarily retained charge into a voltage signal. Therefore, in FIG. 4, the floating diffusion region FD is represented as a capacitor.

The reset transistor TR_RST is connected at the gate electrode thereof to a reset pulse line RST and at the source electrode thereof to the floating diffusion region FD, the source electrode of the transfer gate TR_ROG and the gate electrode of the amplification transistor TR_AMP. Further, the reset transistor TR_RST is connected at the drain electrode thereof to the voltage VDD and the drain electrode of the amplification transistor TR_AMP. In particular, if a reset pulse RST is supplied from the reset pulse line RST, then the reset transistor TR_RST releases the charge of the floating diffusion region FD to reset the floating diffusion region FD under the control of the system control section 115. At this time, when also the transfer gate TR_ROG is placed into an on state by photoelectric conversion, also the charge accumulated by photoelectric conversion by the photodiode PD is released from the reset transistor TR_RST through the floating diffusion region FD.

The amplification transistor TR_AMP is connected at the gate electrode thereof to the source electrode of the reset transistor TR_RST, the source electrode of the transfer gate TR_ROG and the floating diffusion region FD and at the drain electrode thereof to the voltage VDD and the drain electrode of the reset transistor TR_RST.

Further, the amplification transistor TR_AMP is connected at the source electrode thereof to the drain electrode of the selection transistor TR_SEL. The amplification transistor TR_AMP amplifies a reception light signal applied to the gate thereof and serving as a charging voltage for the floating diffusion region FD and outputs the amplified reception light signal from the source electrode of the transfer gate.

The selection transistor TR_SEL is connected at the gate electrode thereof to a selection pulse line SEL, at the drain electrode thereof to the source electrode of the amplification transistor TR_AMP and at the source electrode thereof to a vertical signal line VSL. Therefore, if a selection pulse SEL is supplied from the selection pulse line SEL to the selection transistor TR_SEL, then the selection transistor TR_SEL outputs a signal, which is an amplified reception light signal of the voltage of the floating diffusion region FD outputted from the source of the amplification transistor TR_AMP, from the vertical signal line VSL under the control of the system control section 115. A constant current source I is provided on the vertical signal line VSL and controls the value of current to flow to the vertical signal line VSL to a fixed state. It is to be noted that the constant current source I configures the constant current supply section 119 shown in FIG. 3.

It is to be noted that, although the unit pixels of the dummy row are not shown, they have a configuration similar to that of the unit pixels described hereinabove which contribute to image display. However, the photodiode PD in the unit pixels of the dummy row is configured so as not to cause photoelectric conversion in order that it may not contribute to image display. Accordingly, the unit pixels of the dummy pixel are either configured such that, for example, the light receiving face thereof is physically blocked or configured such that the N-type embedded layer N- of the photodiode PD is not formed from a circuit configuration. Driving Process of the CMOS Image Sensor 100 of FIG. 3

Figure 6:
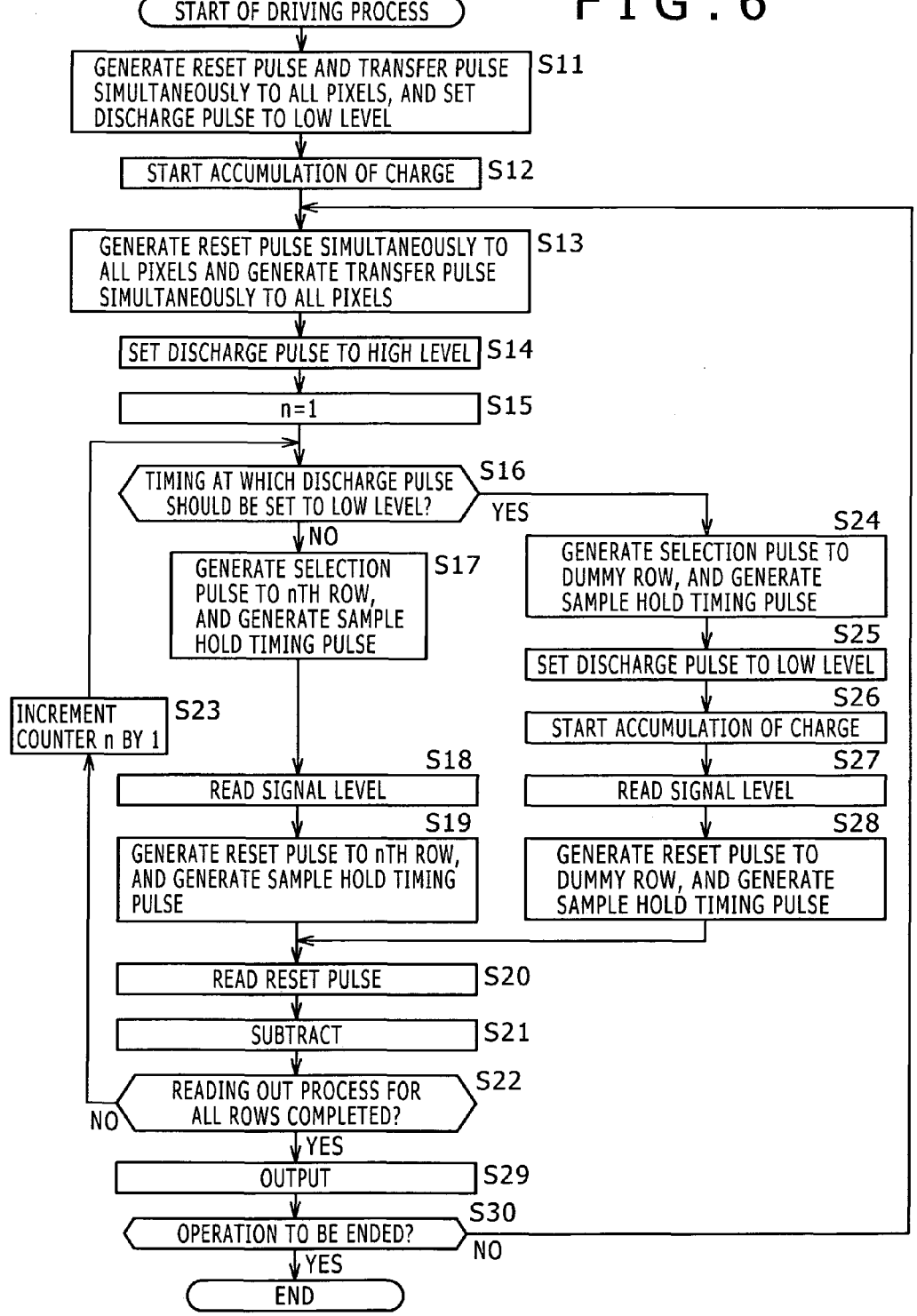
FIGS. 6 and 7 are a flow chart and a timing chart, respectively, illustrating a driving process of the CMOS image sensor of FIG. 3.

Now, a driving process of the CMOS image sensor 100 of FIG. 3 is described with reference to a flow chart of FIG. 6 and a timing chart of FIG. 7. It is to be noted that, in FIG. 7, three groups of waveforms from the top illustrate generation timings of the reset pulse RST, transfer pulse ROG, discharge pulse OFG and selection pulse SEL to the pixels in the n−1th to n+1th rows of the pixel array section 111, respectively. Further, in the fourth waveform group from above, generation timings of the reset pulse RST, transfer pulse ROG, discharge pulse OFG and selection pulse SEL to the pixels in the dummy row are illustrated. Further, in the lowermost waveform group, generation timings of sample hold timing pulses SHS and SHN are illustrated.

Figure 7:
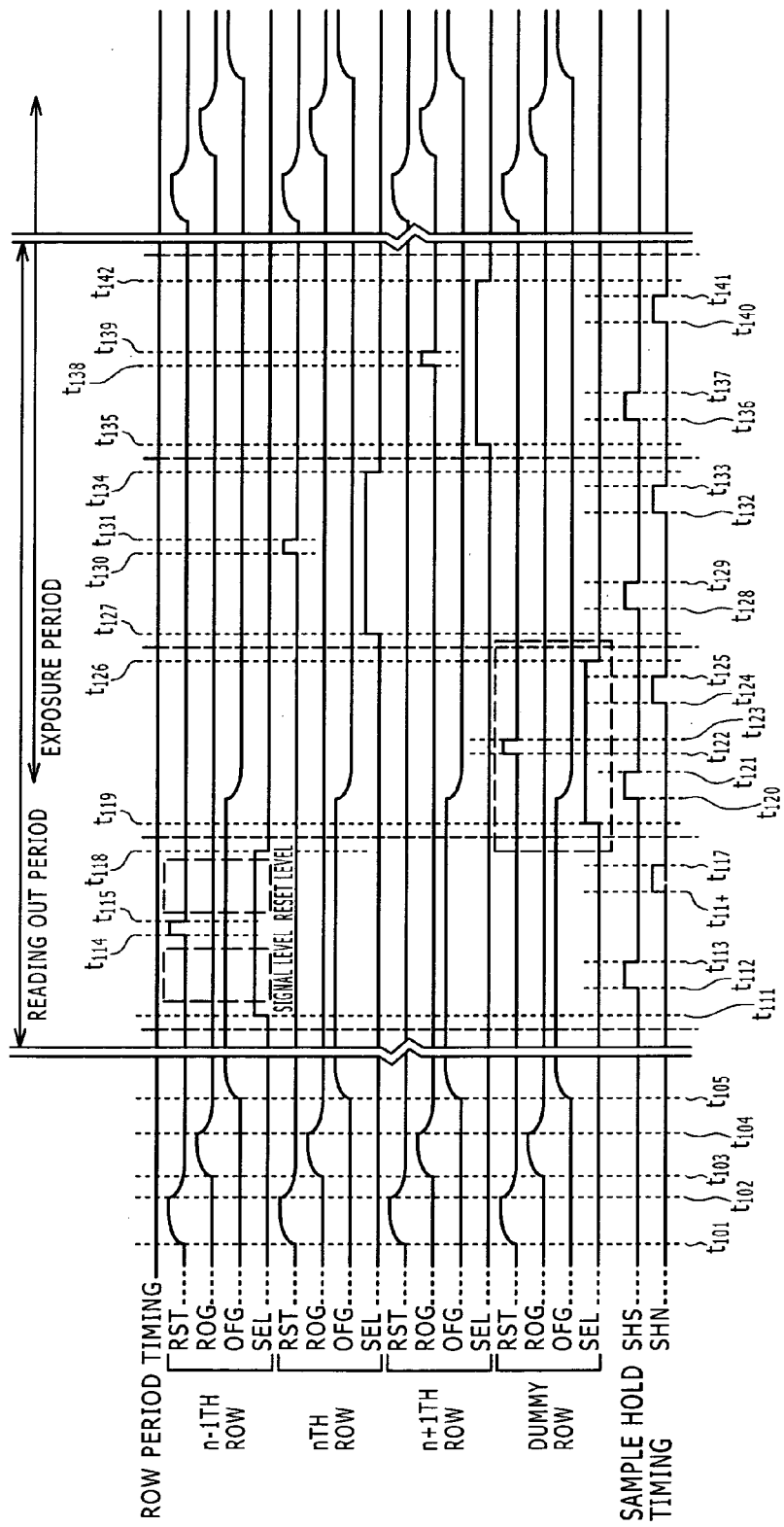

First at step S11, the system control section 115 generates, though not illustrated in FIG. 7, a reset pulse RST and a transfer pulse ROG to the reset pulse line RST and the transfer pulse line ROG, respectively, of all pixels and generates a discharge pulse OFG at the low level. In particular, by this processing, global resetting by which the photodiode PD is reset at the same time with regard to all pixels is carried out.

Then at step S12, accumulation of charge generated by photoelectric conversion by the photodiode PD is started.

At step S13, the system control section 115 generates a reset pulse RST to the reset pulse line RST of all pixels when a predetermined exposure time period elapses, for example, as indicated by time t101 to time t102 of FIG. 7. Thereafter, the system control section 115 generates a transfer pulse ROG to the transfer pulse line ROG of all pixels at a timing immediately after the reset pulse RST, for example, as indicated by time t103 to time t104 of FIG. 7.

As a result, the transfer gate TR_ROG is placed into an on state in response to the transfer pulse ROG, and consequently, charge as a reception light signal accumulated in the photodiode PD during the exposure period is transferred to the floating diffusion region FD. In particular, global transfer is carried out.

At step S14, the system control section 115 generates a discharge pulse OFG in the high level state, for example, as indicated by time t105 of FIG. 7. By this process, the charge remaining in the photodiode PD is discharged to the discharge drain line OFD and the photodiode PD is reset.

At step S15, the system control section 115 resets a counter n for counting the number of rows to 1.

At step S16, the system control section 115 decides whether or not the time at present is a timing at which the discharge pulse OFG is to be generated in the low level in order to start an exposure period. If it is decided at step S16 that, for example, the time at present is not a timing at which a discharge pulse OFG is to be generated in the low level, then the processing advances to step S17.

At step S17, the system control section 115 determines the nth row as a processing object row and generates a selection pulse SEL through the selection pulse line SEL to the pixels of the processing object row. For example, if the processing object row is the n−1th row, then a selection pulse SEL is generated within a period from time t111 to time t118 of FIG. 7. Consequently, the vertical signal lines VSL are rendered valid and transfer charge as a reception light signal from the floating diffusion region FD. Simultaneously, the system control section 115 generates a sample hold timing pulse SHS to the column processing section 113. In particular, in the case where the processing object row is the n−1th row, a sample hold timing pulse SHS is generated within such a generation period of a selection pulse SEL as a period from time t112 to time t113 in FIG. 7.

At step S18, the column processing section 113 stores the reception light signal read out through the vertical signal line 117 (VSL) as information of a signal level in response to the sample hold timing pulse SHS. In particular, in the case of the unit pixels in the n−1th row, a reception light signal of a signal level is read out at a timing in the proximity of the period from time t112 to time t113 indicated by a broken line in FIG. 7.

At step S19, the system control section 115 generates a reset pulse RST to the reset pulse line RST for the pixels of the processing object row. In particular, for example, in the case where the processing object row is the n−1th row, a reset pulse RST is generated within a period from time t114 to time t115 which is an intermediate timing within the generation period of the selection pulse SEL. By this process, the floating diffusion region FD of the pixels of the processing object row is reset. Further, the system control section 115 generates a sample hold timing pulse SHN to the column processing section 113. In particular, in the case where the processing object row is the n−1th row, a sample hold timing pulse SHN is generated within the generation period of the selection pulse SEL such as a period from time t116 to time t117.

At step S20, the column processing section 113 stores the reception light signal supplied thereto from the vertical signal line 117 (VSL) as information of a reset level in response to the sample hold timing pulse SHN. In particular, in the case of the unit pixels of the n−1th row, a reception light signal of the reset level is read out at a timing in the proximity of a period from time t116 to time t117 indicated by a straight line in FIG. 7.

At step S21, the column processing section 113 subtracts a value of the reception light signal of the reset level from the reception light signal of the signal level stored therein to determine a difference between them. Then, the column processing section 113 supplies the reception light signal as a signal level of each of the pixels in the row corresponding to the calculated difference successively at a timing at which the column is selected by the horizontal drive section 114 to the signal processing section 118.

At step S22, the system control section 115 decides whether or not reading out for all rows is completed. For example, if some row which is not processed as yet remains, then the counter n is incremented by one at step S23, whereafter the processing returns to step S16. In other words, the processes at steps S16 to S28 are repeated until reception light signals of the light reception level and the reset level of the pixels of all rows are read out and the difference between the reception light signals is stored as a signal level.

If it is decided at step S22 that the reception light signals of the pixels of all rows are read out, then the processing advances to step S29.

At step S29, the signal processing section 118 outputs the reception light signals as pixel information for one image.

At step S30, the system control section 115 decides whether or not an instruction to end the operation is received. If it is decided that an instruction to end the operation is not received, then the processing returns to step S13. On the other hand, if it is decided at step S30 that, for example, an operation section not shown is operated to issue an instruction to end the operation, then the processing is ended.

On the other hand, if it is decided at step S16 that the time at present is a timing at which a discharge pulse OFG is to be generated, then the processing advances to step S24.

At step S24, the system control section 115 determines the dummy column 111a as a processing object row and generates a selection pulse SEL to the pixels of the dummy row through the selection pulse line SEL. For example, in the case where an exposure period is started after processing of the n−1th row, the system control section 115 generates a selection pulse SEL to the dummy row within a period from time t119 to time t126 illustrated in FIG. 7. Consequently, the vertical signal lines VSL for the dummy row are rendered valid so that charge as a reception light signal is transferred from the floating diffusion region FD. However, since the photodiodes PD in the dummy row do not carry out photoelectric conversion, the reception light signal outputted is ideally zero. At this time, the system control section 115 simultaneously generates a sample hold timing pulse SHS to the column processing section 113. In particular, a sample hold timing pulse SHS is generated with such a generation period of the selection pulse SEL as a period from time t120 to time t121 of FIG. 7.

At step S25, the system control section 115 generates a discharge pulse OFG of the low level through the discharge pulse line OFG at time t120, for example, as seen in FIG. 7 to all pixels.

At step S26, the gate electrode of the discharge transistor TR_OFG of all pixels is placed into an off state in response to the discharge pulse OFG of the low level thereby to establish a state in which charge is accumulated as a reception light signal of the photodiode PD of all pixels. Consequently, an exposure time period is started.

At step S27, the column processing section 113 stores the reception light signals read out though the vertical signal lines 117 (VSL) as information of the signal level in response to the sample hold timing pulse SHS. In particular, since the processing object row is the dummy row, the reception light signals of the signal level are read out, for example, at a timing in the proximity of the period from time t120 to time t121 indicated by a broken line in FIG. 7.

At step S28, the system control section 115 generates a reset pulse RST through the reset pulse line RST to the pixels of the dummy row 111a which is the processing object row. For example, in the case where an exposure period is started at a timing after the process for the n−1th row, the system control section 115 generates a reset pulse RST to the dummy row within a period from time t122 to time t123 of FIG. 7. Consequently, charge as a reception light signal accumulated in the floating diffusion region FD in the dummy row is released to reset the pixels of the dummy row. However, since the photodiode PD does not carry out photoelectric conversion, ideally the reception light signal accumulated in the floating diffusion region FD is zero. At this time, the system control section 115 simultaneously generates a sample hold timing pulse SHN to the column processing section 113. In particular, to the pixels of the dummy row, the system control section 115 generates a sample hold timing pulse SHN within such a generation period of a selection pulse SEL as a time period from time t124 to time t125 of FIG. 7.

Then, the processing returns to step S20, at which the column processing section 113 stores the reception light signal supplied thereto through the vertical signal line 117 (VSL) as information of the reset level in response to the sample hold timing pulse SHN. In particular, in the case where an exposure period is started at a timing next to the timing of the N−1th row, the reception light signal of the reset level is read out at a timing in the proximity of the period from time t124 to time t125 indicated by a broken line in FIG. 7.

At step S21, the column processing section 113 subtracts a value of the reception light signal of the reset level from the reception light signal of the signal level stored therein to determine a difference between them. Then, the column processing section 113 supplies the reception light signal as a signal level of each of the pixels in the row corresponding to the calculated difference successively at a timing at which the column is selected by the horizontal drive section 114 to the signal processing section 118.

In particular, when an exposure period is started, since a discharge pulse OFG is generated for all pixels, upon transition, the wiring line capacitance, gate capacitance and so forth over the overall area of the pixels are charged or discharged as described hereinabove. Therefore, by appearance of an IR drop of the power supply lines or transition of signals over the overall area of the pixels, such a bad influence that other signal lines are influenced by coupling appears.

According to the related art, this transition is caused to occur avoiding a period for signal reading out or A/D conversion which is liable to be influenced by noise. However, it is difficult to secure the period with a sensor whose timing is ready for high speed operation in recent years and which has the pipeline configuration described hereinabove.

In order to cope with such a situation as just described, in the process described above, all pixels are controlled such that they do not carry out photoelectric conversion having no relation to image signals obtained by original imaging within a row period within which a discharge pulse OFG of the low level is inputted simultaneously to the discharge pulse lines OFG. Further, the dummy row in which accumulation of charge is not carried out is controlled so that the reception light signal is read out from the dummy row. As described above, the dummy row is provided principally so as not to carry out photoelectric conversion while it has a circuit configuration and a layout configuration similar to those of the original pixels. Thus, since photoelectric conversion is not carried out, even if light is inputted to the pixels of the dummy row, the pixels do not have such a bad influence as blooming on surrounding pixels. Further, except this, the pixels of the dummy row are configured similarly to the pixels for image display, and therefore, the vertical drive section 112 can minimize the load variation within a row period.

A main factor of such a bad influence that noise is generated appears when the level of the discharge pulse line OFG of all pixels simultaneously changes from the high level to the low level. Therefore, a period of time other than reading and A/C conversion periods is set compulsorily only within the row period. It is to be noted that the foregoing description relates to an example wherein, when the level of the discharge pulse lines OFG simultaneously changes from the high level to the low level, a reading process of the reception light signal from the dummy row is executed. However, all pixels may be controlled otherwise such that the reading out process is not carried out therefor while a process for changing the level of the discharge pulse OFG for all pixels simultaneously from the high level to the low level, which is a main factor of the bad influence described above.

However, such a series of operations as reading out, A/D conversion and horizontal transfer are carried out in a cycle of a fixed row period, and the operation described above disorders the cycle. It is known that an IR drop of the power supply caused by a variation of current consumption of the power supply appears, upon reading out of a row whose row period is elongated or of a row after reading out itself is stopped, as noise such as an offset of a row on an output image because the row becomes different from another row whose reading out is carried out regularly. Accordingly, reading out of the dummy row operates so as to make reading out fixed within a row period. Further, since the pixel structure of the dummy row is made similar to the ordinary pixel structure, such a power supply variation as described can be minimized. As a result, it is possible to reduce noise and measure the signal level with a higher degree of accuracy.

It is to be noted that, after the reading out of the dummy row comes to an end, the reading out processing is repeated till a timing at which a next discharge pulse OFG is started again.

Accordingly, after the reading out of the dummy row comes to an end, for example, a selection pulse SEL for the nth row is generated within a period from time t127 to time t134. Within the period, a sample hold timing pulse SHS is generated within a period from time t128 to time t129, and a reset pulse RST is generated within a period from time t130 to time t131 to read out the signal level of the pixels of the nth row. Further, in the proximity of a period from time t132 to time t133, a sample hold timing pulse SHN is generate to read out the reset level of the pixels of the nth row.

Then, after the processing for the nth row comes to an end, since processing for the n+1th row is to be started, a selection pulse SEL for the n+1th row is generated within a period from time t135 to time t142. Within the period, a sample hold timing pulse SHS is generated within a period from time t136 to time t137, and a reset pulse RST is generated within a period from time t138 to time t139 to read out the reset level of the pixels of the n+1th row. Further, within a period from time t140 to time t141, a sample hold timing pulse SHN is generated to read out the reset level of the pixels of the n+1th row.

In particular, by the processing described above, at a timing at which a discharge pulse OFG is generated to turn off the discharge transistor TR_OFG, a process similar to the reading out process in a unit of a row is executed for the dummy row which does not contribute to image display. Therefore, reading out at a timing at which an influence of noise is liable to be had can be prevented, and as a result, generation of noise can be reduced.

It is to be noted that, since substantially only it is necessary to be able to avoid reading out at a timing at which an influence of noise is liable to be had, only a selection pulse SEL, a reset pulse RST and sample hold timing pulses SHS and SHN for the pixels of the dummy row may be generated while operation of the selection transistors TR_SEL, reset transistors TR_RST, column processing section 113 and so forth is kept stopped. Further, within a period relating to a processing timing for the dummy row, that is, at a timing at which an influence of noise is liable to be had, a discharge pulse OFG may be generated to cause the discharge transistor TR_OFG to operate while it does not carry out any other operation. Further, while, in the foregoing description, an example wherein only one row is provided as the dummy row such that a reading out operation for one row is carried out is described, if the timing at which an influence of noise is liable to be had is longer than the period, then a plurality of dummy rows may be provided corresponding to the length such that reading out of the pixels of the dummy rows is carried out repetitively. Or the pixels of the same dummy row may be read out by a plural number of times.

Further, since only it is necessary to generate a pulse for instructing those pixels, which do not contribute to image display, to carry out reading out or cause those pixels to carry out reading out, for example, pixels from which only noise is read out in a unit of a pixel, that is, optical blacks OPB, may be utilized similarly to the dummy row.

Further, in the case where a reset pulse RST, a transfer pulse ROG and a discharge pulse OFG are generated for all pixels, the waveform of them in FIG. 7 does not exhibit a steep rising edge but exhibits a dull rising edge. This arises from the fact that, since charge or discharge is carried out for wiring line capacitance or gate capacitance of all pixels, where all rows are driven, the period of charge or discharge becomes an order of several microseconds to several tens of microseconds although, in the case where only one row is driven, the period of charge or discharge becomes an order of several tens of nanoseconds to several hundreds of nanoseconds.

<2. Second Embodiment>
Other Examples of the Configuration of the Solid-State Imaging Device In the foregoing description, a dummy row of a configuration same as that of pixels which contribute to image display is provided and a reading out process of the dummy row is executed compulsorily at a timing at which an influence of noise is liable to be had thereby to avoid reading out at the timing at which an influence of noise is liable to be had. However, since only it is necessary to carry out reading out of a row of pixels which do not contribute to image display, for example, at a timing at which an influence of noise is liable to be had, reading out from a row whose reception light signal has been read out once may be carried out again.

Figure 8:
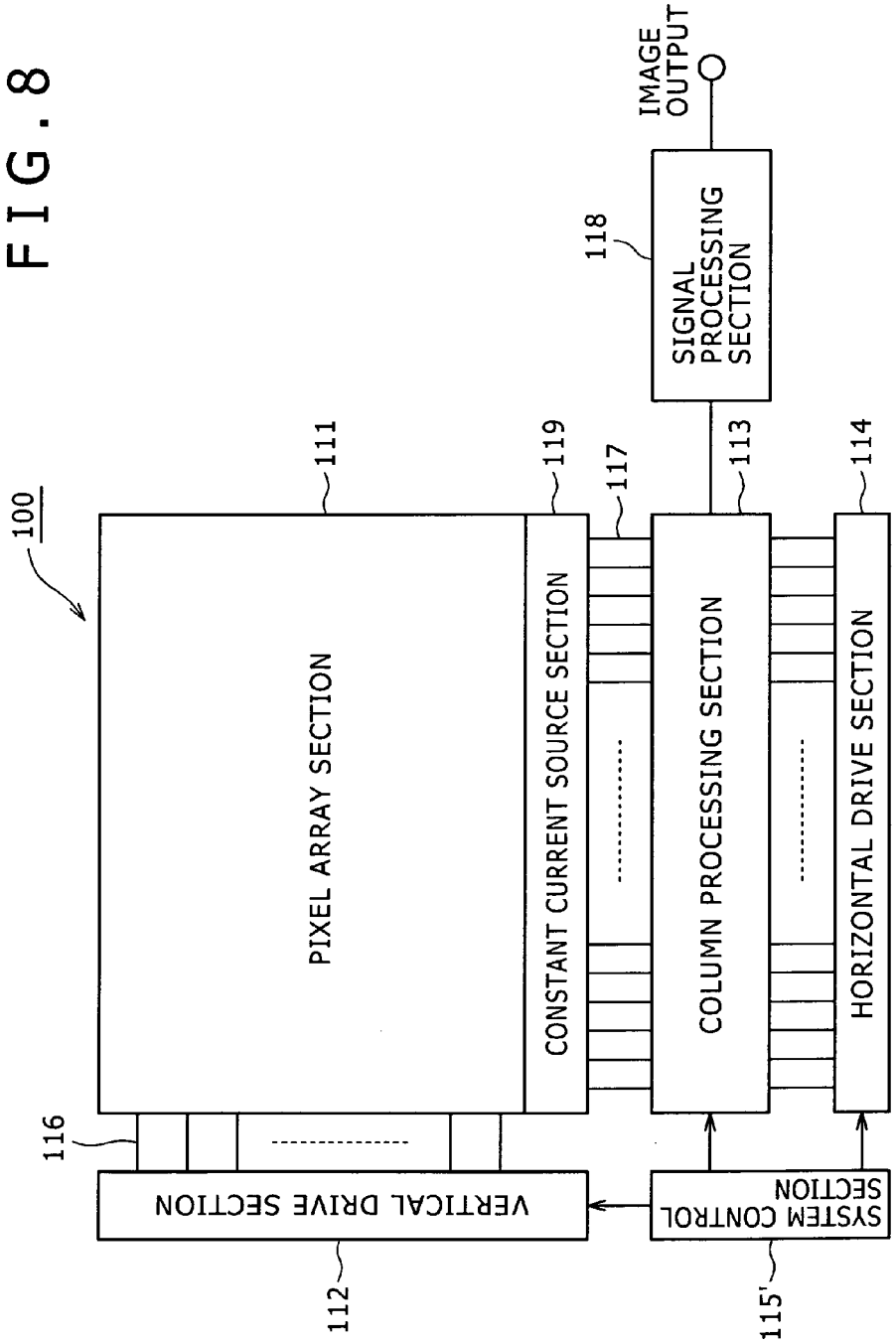
FIG. 8 is a block diagram showing an example of a configuration of a CMOS image sensor according to a second embodiment of the present invention.

FIG. 8 shows an example of a configuration of a CMOS image sensor 100 wherein a reception light signal of a row from which the reception light signal is read out once is read out again.

In particular, the CMOS image sensor 100 of FIG. 8 is similar in configuration to the CMOS image sensor 100 of FIG. 3 except that the pixel array section 111 does not include the dummy row 111*a* and that a system control section 115' is provided in place of the system control section 115.

The system control section 115' has basic functions similar to those of the system control section 115. However, the system control section 115' controls such that, at a timing at which an influence of noise is liable to be had, a reception light signal of a row from which the reception light signal is read out once is read out again. It is to be noted that the unit pixels 120 disposed on the pixel array section 111 of the CMOS image sensor 100 of FIG. 8 are similar to those in FIG. 3, and therefore, overlapping description of the same is omitted herein to avoid redundancy.

Driving Processing of the CMOS Image Sensor 100 of FIG. 8

Figure 9:
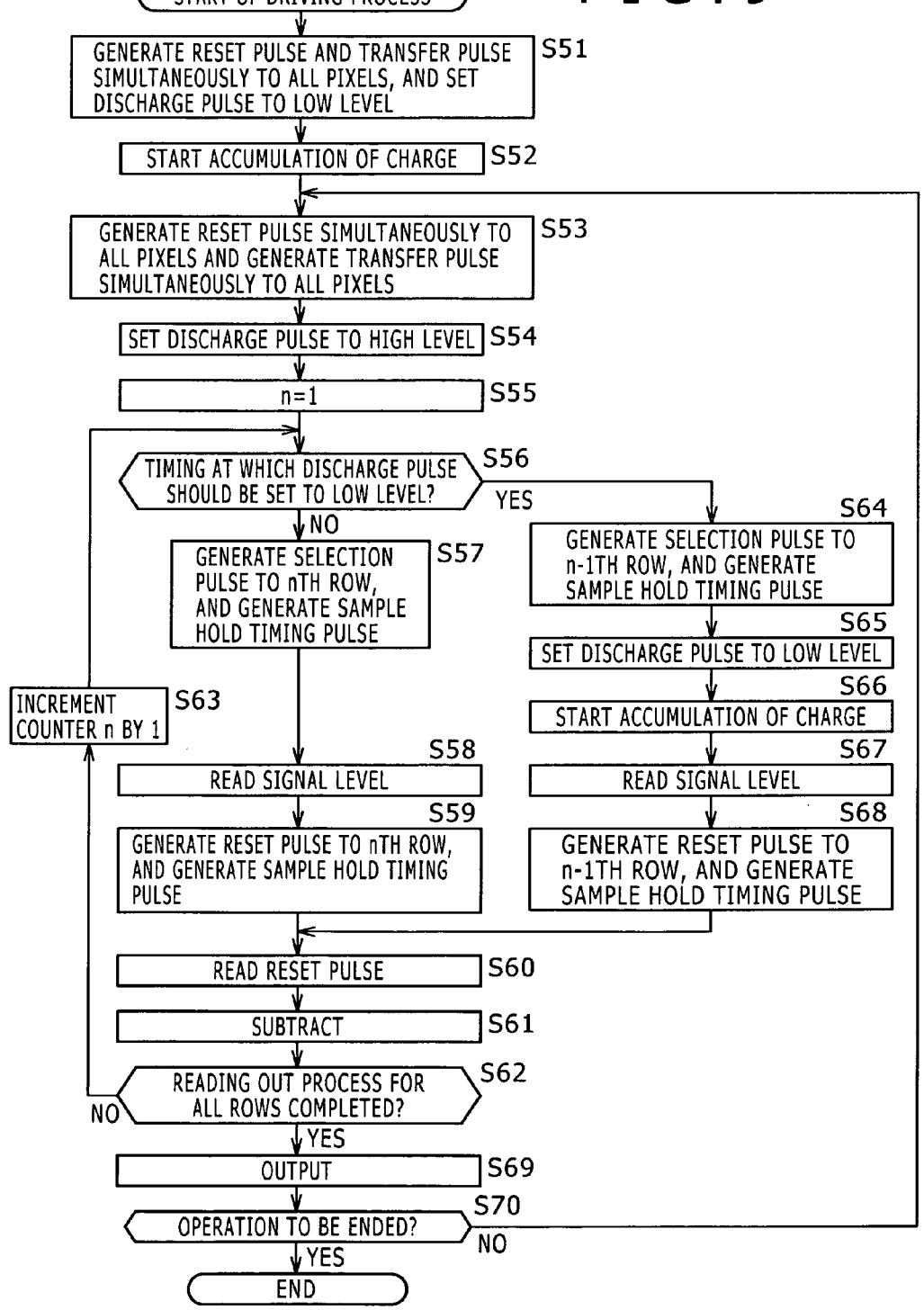
FIGS. 9 and 10 are a flow chart and a timing chart, respectively, illustrating a driving process of the CMOS image sensor of FIG. 8.

Now, driving processing of the CMOS image sensor 100 of FIG. 8 is described with reference to a flow chart of FIG. 9 and a timing chart of FIG. 10. It is to be noted that, in FIG. 10, three groups of waveforms from the top illustrate generation timings of the reset pulse RST, transfer pulse ROG and selection pulse SEL to the pixels in the n−1th to n+1th rows of the pixel array section 111, respectively. Further, in the lowermost waveform group, generation timings of sample hold timing pulses SHS and SHN are illustrated. Further, it is to be noted that processes at steps S51 to S63, S69 and S70 in the flow chart of FIG. 9 are similar to those at steps S11 to S23, S29 and S30 in the flow chart of FIG. 6, respectively, and therefore, overlapping description of the processes at the steps mentioned is omitted herein to avoid redundancy.

In particular, for example, if it is decided at step S56 that the present point of time is a timing at which a discharge pulse OFG is to be generated, then the processing advances to step S64.

At step S64, the system control section 115' determines the n−1th row as a processing object row and generates a selection pulse SEL through the selection pulse line SEL to the pixels of the n−1th row. For example, in the case where an exposure period is to be started at a timing after the processing for the n−1th row, the system control section 115' generates a selection pulse SEL to the n−1th row same as the row which has been read immediately before then within a period from time t119 to time t126 of FIG. 10. Consequently, the vertical signal lines VSL for the n−1th row whose reception light signal has been read out already by the immediately preceding process are rendered valid, and charge as the reception light signal is transferred from the floating diffusion region FD. However, since the reception light signal has been read out by the immediately preceding process, the reception light signal to be outputted from the floating diffusion regions FD in the n−1th row is ideally zero. At this time, the system control section 115' simultaneously generates a sample hold timing pulse SHS to the column processing section 113. In particular, the system control section 115' generates a sample hold timing pulse SHS to the pixels of the n−1th row within such a generation period of a selection pulse SEL as a period from time t120 to time t121 in FIG. 10.

Figure 10:
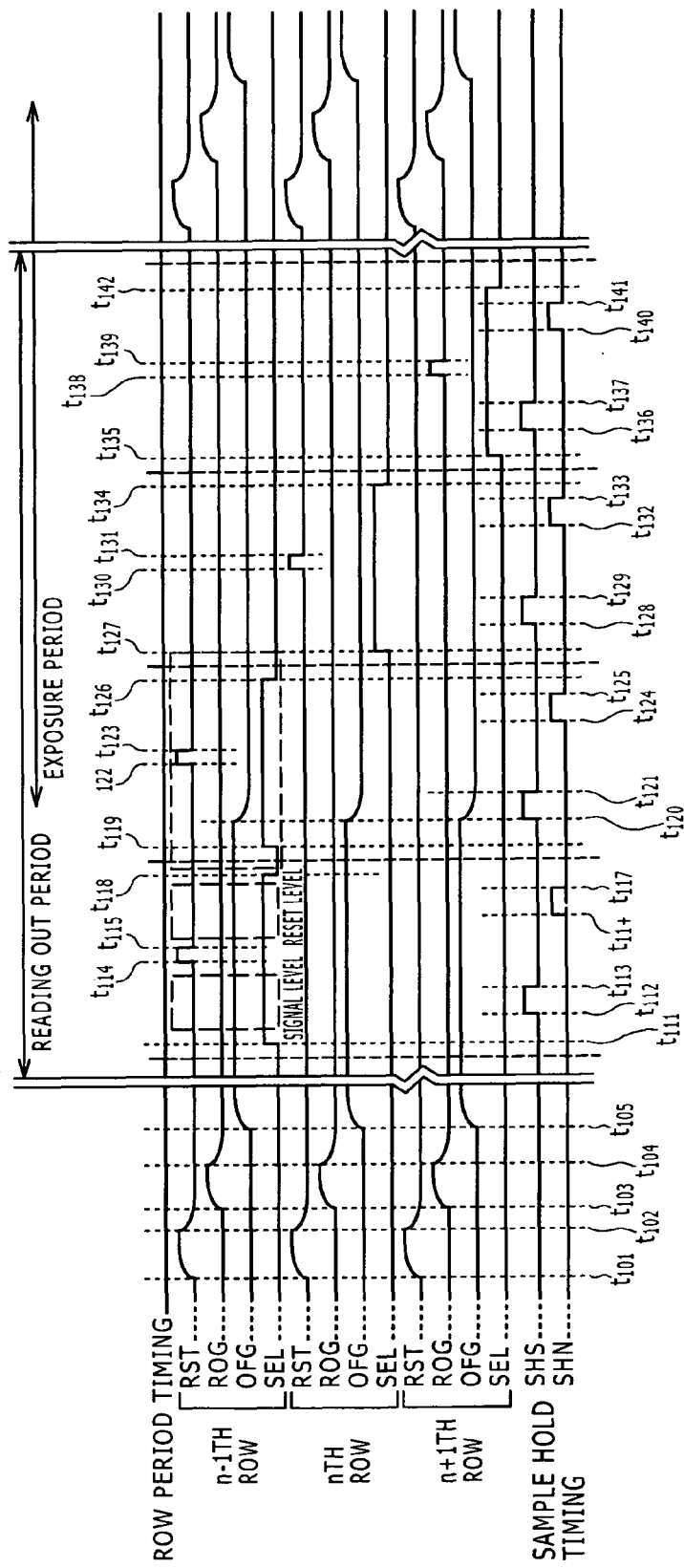

At step S65, the system control section 115' generates a discharge pulse OFG of the low level through the discharge pulse line OFG, for example, at time t120 as seen in FIG. 10.

At step S66, the gate electrode of the discharge transistor TR_OFG of all pixels is placed into an off state in response to the discharge pulse OFG of the low level thereby to establish a state in which charge as a reception light signal of the photodiode PD of all pixels is accumulated. Consequently, an exposure period is started.

At step S67, the system control section 115' generates a reset pulse RST through the reset pulse line RST to the pixels in the n−1th row which is a processing object row. For example, in the case where the exposure period is to be started at a timing after the processing for the n−1th row, the system control section 115' generates a reset pulse RST to the n−1th row within a period from time t122 to time t123 of FIG. 10. Consequently, charge as the reception light signal accumulated in the floating diffusion region FD in the n−1th row is released to reset the floating diffusion region FD. However, since the reception light signals accumulated in the floating diffusion regions FD in the n−1th row have been read out already by the immediately preceding process, ideally the reception light signal accumulated in the floating diffusion region FD is zero. At this time, the system control section 115' simultaneously generates a sample hold timing pulse SHN to the column processing section 113. In particular, the system control section 115' generates a sample hold timing pulse SHN within such a generation period of the selection pulse SEL as a time period from time t124 to time t125 of FIG. 10.

Then at step S60, the column processing section 113 stores the reception light signal supplied thereto through the vertical signal line 117 (VSL) as information of the reset level in response to the sample hold timing pulse SHN. In particular, in the case where an exposure period is to be started at a timing next to the N−1th row, the reception light signal of the reset level of the pixels in the N−1th row is read out at a timing within a time period from time t124 to time t125 indicated by a broken line in FIG. 10.

At step S61, the column processing section 113 subtracts the value of the reception light signal of the reset level from the reception light signal of the signal level stored therein to calculate the difference. Then, the column processing section 113 supplies the reception light signal as a signal level of each of the pixels in the row corresponding to the calculated difference successively at a timing at which the column is selected by the horizontal drive section 114 to the signal processing section 118.

In particular, in the processes described above, the reception light signals of a row from which the reception light signals have already been read out and accordingly have no relationship to original image signals obtained by imaging are controlled so as to be read out within a row period within which a discharge pulse OFG of the low level is inputted simultaneously to the discharge pulse lines OFG for all pixels. In other words, the processing for the dummy pixel described hereinabove is executed for a row from which reading out of reception light signals is completed already. Therefore, working effects similar to those achieved where the dummy row is provided are exhibited. It is to be noted that, since the similar processing can be executed only with the pixels which are required substantially, it can be applied also to the existing pixel array section 111 using a software program. Further, since the circuit relating to the dummy pixel is unnecessary, the cost can be reduced and also occurrence of an IR drop can be reduced.

<3. Third Embodiment>

Other Examples of the Configuration of the Solid-State Imaging Device

In the foregoing description, an example is described wherein a reading out process for a row same as a row formed from pixels from which a reception light signal is read out already and which do not contribute to image display at a timing at which an influence of noise is liable to be had is carried out compulsorily to avoid reading out at a timing at which an influence of noise is liable to be had. However, in the case where the countermeasure described is taken, a timing at which a reception light signal of an unnecessary row is read out is generated, and consequently, image signals are supplied discontinuously. Therefore, it is necessary in signal processing on the succeeding stage to carry out such an additional process as to remove the unnecessary row. Therefore, a line memory and a selector may be provided so that image signals are supplied continuously.

Figure 11:
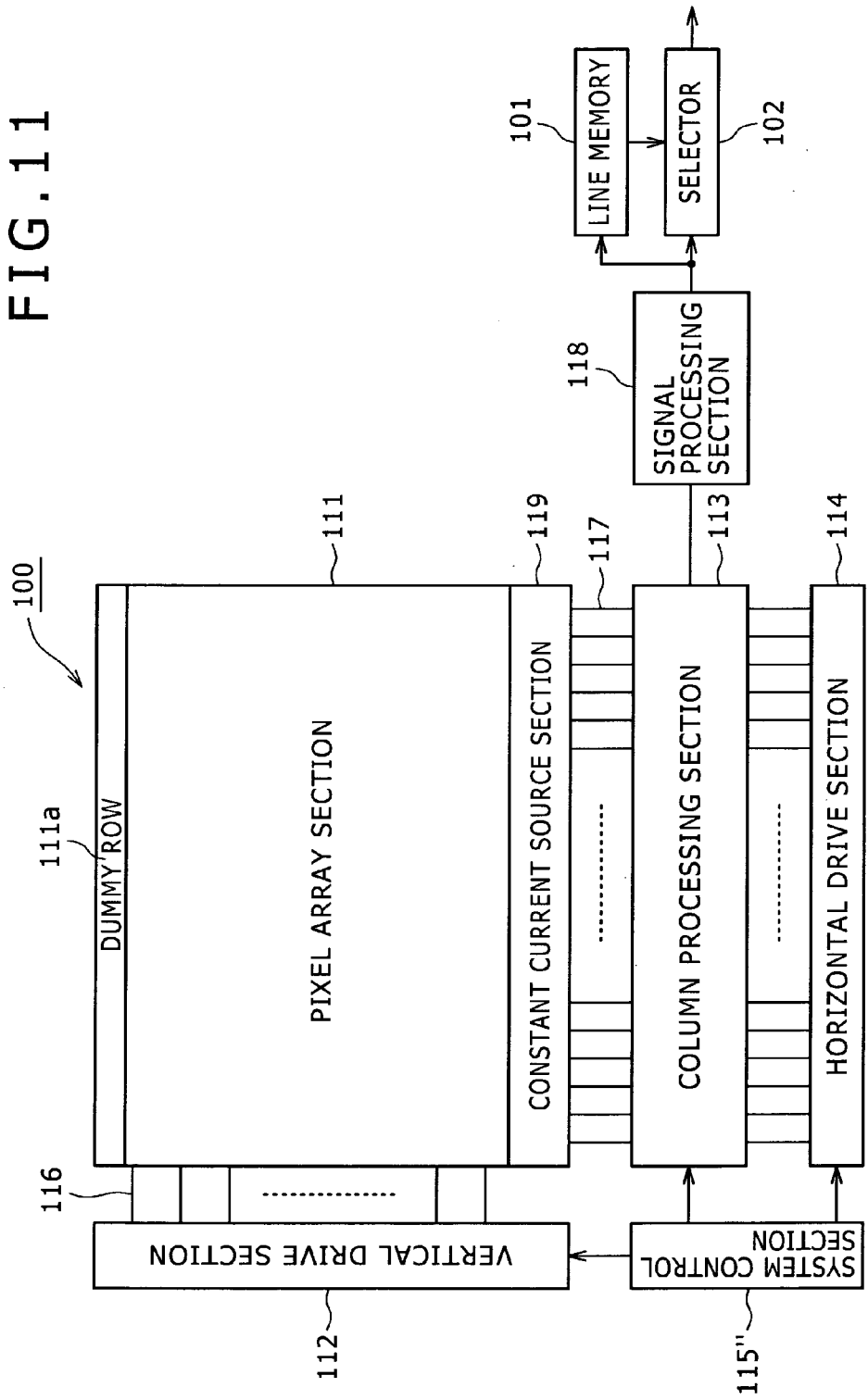
FIG. 11 is a block diagram showing an example of a configuration of a CMOS image sensor according to a third embodiment of the present invention.

FIG. 11 shows an example of a configuration of a CMOS image sensor 100 which includes a line memory and a selector such that image signals are supplied successively even if reading out at a timing at which an influence of noise is liable to be had is avoided.

In particular, the CMOS image sensor 100 of FIG. 11 is similar in configuration to the CMOS image sensor 100 of FIG. 3 except the structure of a unit pixel which configures the pixel array section 111 and except that a system control section 115" is provided in place of the system control section 115'. Further, the CMOS image sensor 100 of FIG. 11 includes a line memory 101 and a selector 102.

The system control section 115" has basic functions similar to those of the system control section 115'. However, the system control section 115" carries out such control as to read out, at a timing at which an influence of noise is liable to be had, reception light signals from a row, from which the reception light signals have been read out once, once again.

The line memory 101 stores pixel information outputted in a unit of a row from the signal processing section 118 in a unit of a row and supplies the pixel information in a unit of a row to the selector 102. In the case where pixel information other than that of the dummy row is supplied from the signal processing section 118, the selector 102 reads out and outputs pixel information of the immediately preceding row stored in the line memory 101. Further, upon processing of an image of one frame, if information of the dummy row is supplied once, then the selector 102 thereafter outputs pixel signals successively supplied thereto from the signal processing section 118.

Example of a Circuit Configuration of the Unit Pixels of the Pixel Array Section 100 of FIG. 11

Now, an example of the configuration of the unit pixels disposed in the pixel array section 111 of FIG. 11 is described with reference to FIGS. 12 and 13. It is to be noted that FIG. 12 shows a circuit configuration of a unit pixel 120 disposed in the pixel array section 111, and FIG. 13 shows a cross sectional configuration of the unit pixel 120 disposed in the pixel array section 111 of FIG. 11.

Figure 12:
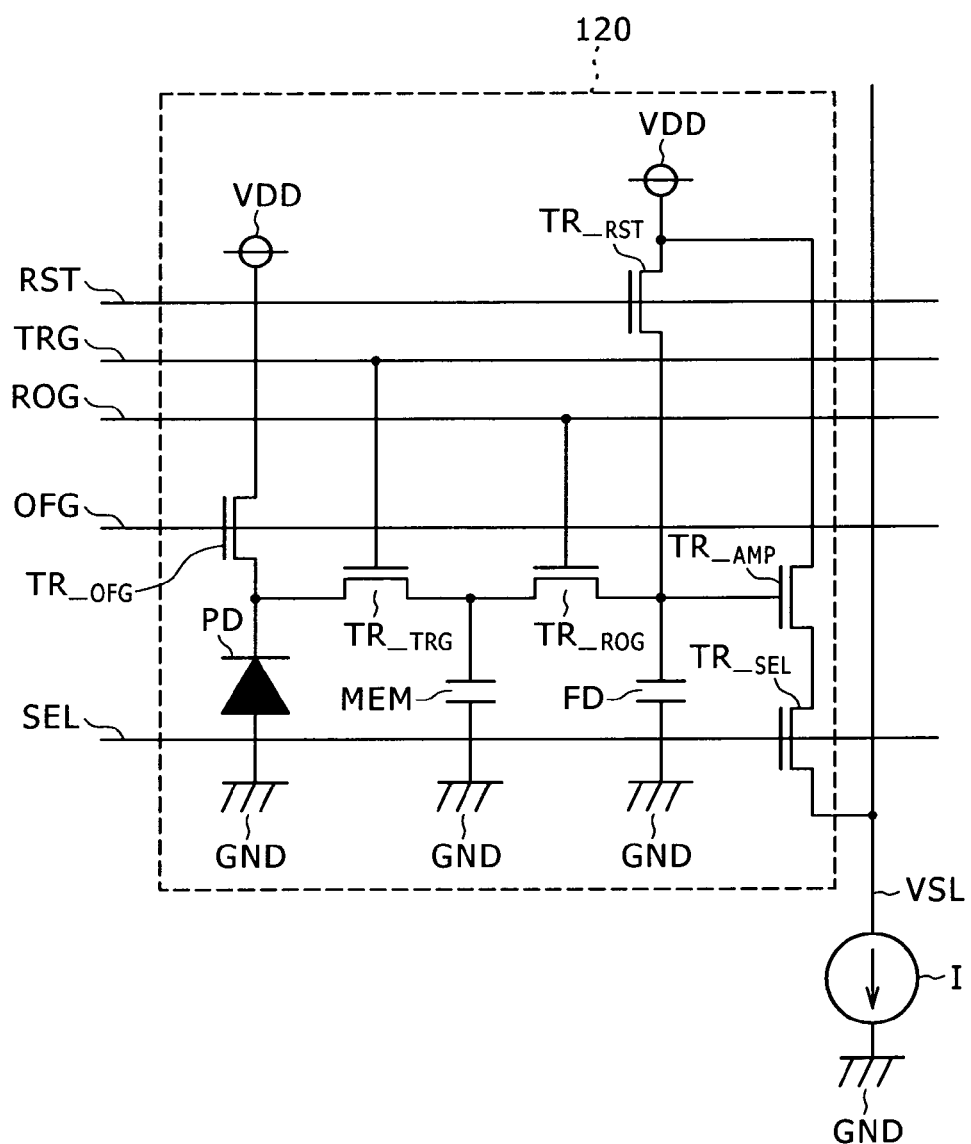
FIG. 12 is a circuit diagram showing an example of a configuration of a unit pixel in a pixel array section shown in FIG. 11.
Figure 13:
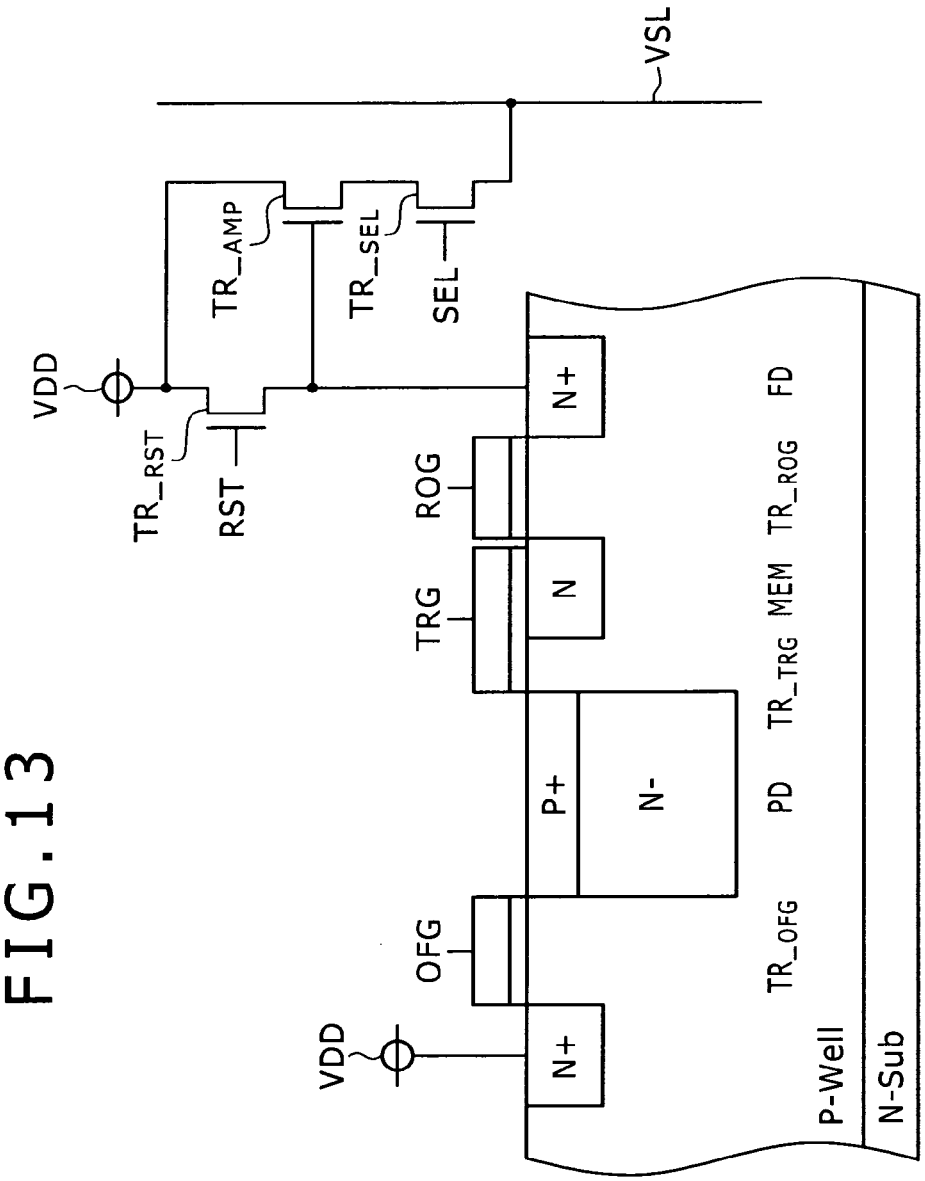
FIG. 13 is a side elevational sectional view showing an example of a configuration of a unit pixel in the pixel array section shown in FIG. 11.

The unit pixel 120 of FIGS. 12 and 13 is similar in configuration to the unit pixel 120 of FIGS. 4 and 5 except that a second transfer gate TR_TRG is provided between the transfer gate TR_ROG and the photodiode PD and that a memory section MEM is provided at a node between the transfer gate TR_ROG and the second transfer gate TR_TRG. It is to be noted that, in the following description, the transfer gate TR_ROG is referred to as first transfer gate TR_ROG and also the corresponding transfer pulse line ROG and transfer pulse ROG are referred to as first transfer pulse line ROG and first transfer pulse ROG, respectively.

The second transfer gate TR_TRG transfers charge generated by photoelectric conversion by and stored in the inside of the photodiode PD in response to a transfer pulse TRG from the transfer pulse line TRG applied to the gate electrode thereof. As seen in FIG. 13, the memory section MEM is formed from an N-type embedded channel, which is a region denoted by "N" in FIG. 13, formed below the gate electrode of the second transfer gate TR_TRG, and accumulates charge transferred thereto from the photodiode PD by the second transfer gate TR_TRG. Since the memory section MEM is formed from the embedded N-type channel, generation of dark current on the interface of Si—SiO$_2$ can be suppressed, which can contribute to improvement in the picture quality.

The gate electrode of the second transfer gate TR_TRG is disposed above the memory section MEM such that modulation can be applied to the memory section MEM by applying a second transfer pulse TRG to the gate electrode of the second transfer gate TR_TRG. In particular, when the second transfer pulse TRG is applied to the gate electrode of the second transfer gate TR_TRG, the potential of the memory section MEM becomes deep. Consequently, the saturation charge amount of the memory section MEM can be increased from that where no modulation is applied.

Driving Process of the CMOS Image Sensor 100 of FIG. 11

Figure 14:
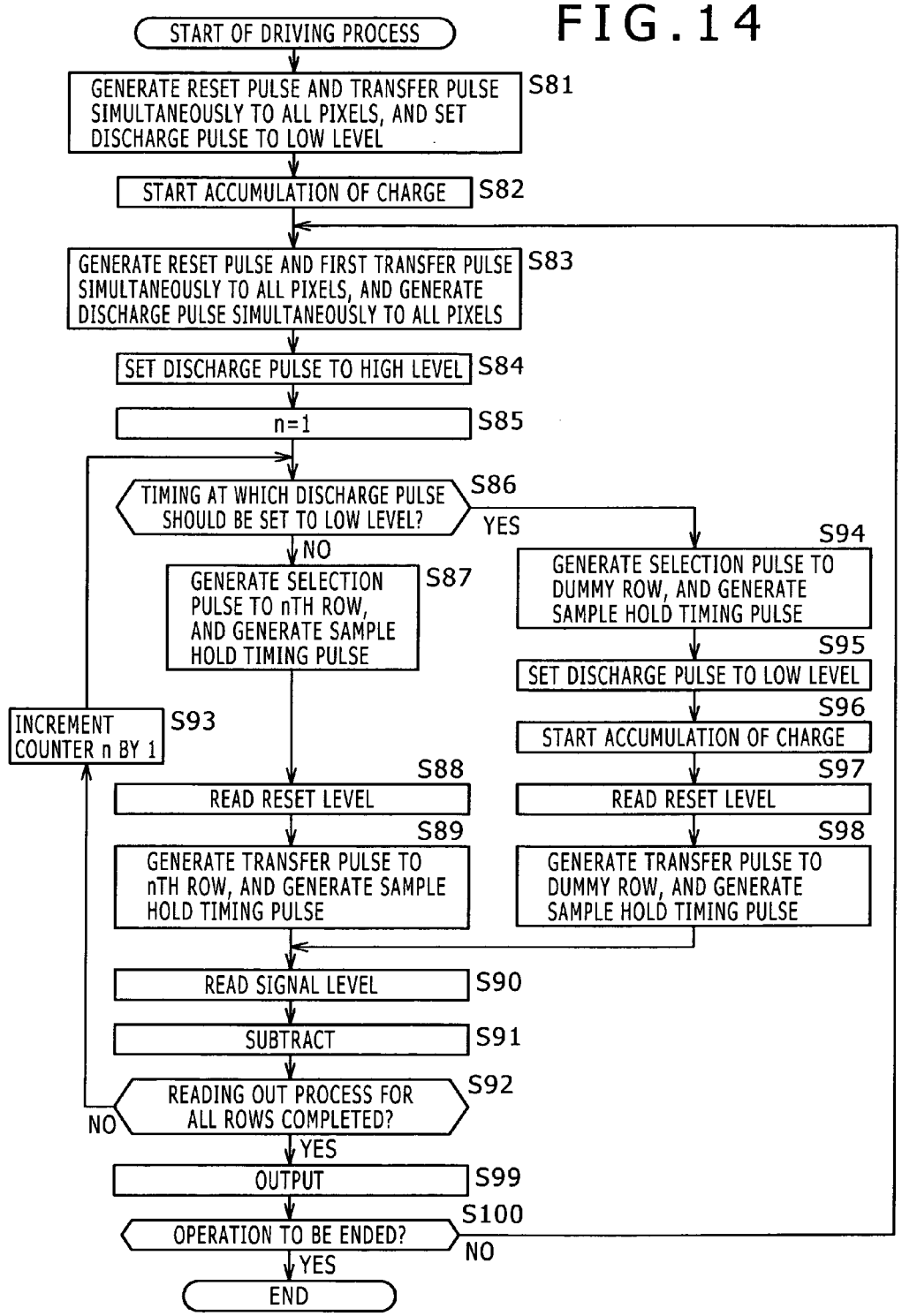
FIGS. 14 and 15 are a flow chart and a timing chart, respectively, illustrating a driving process of the CMOS image sensor of FIG. 11.
Figure 15:
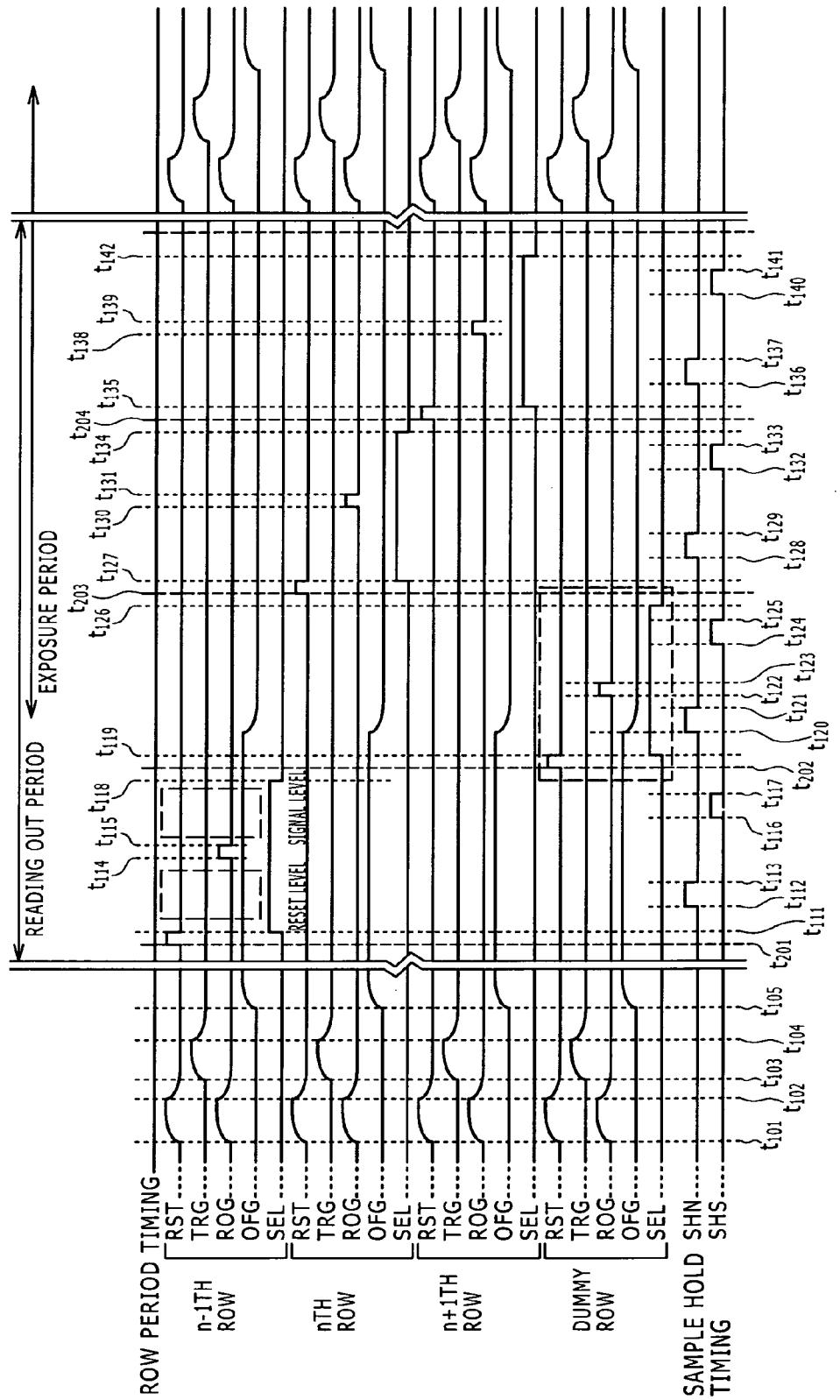

Now, driving processing of the CMOS image sensor 100 of FIG. 11 is described with reference to a flow chart of FIG. 14 and a timing chart of FIG. 15. It is to be noted that, in FIG. 15, three groups of waveforms from the top illustrate generation timings of the reset pulse RST, second transfer pulse TRG, first transfer pulse ROG, discharge pulse OFG and selection pulse SEL to the pixels in the n−1th to n+1th rows of the pixel array section 111, respectively. Further, in the lowermost waveform group, generation timings of sample hold timing pulses SHN and SHS are illustrated. Further, it is to be noted that the displayed positions of the sampling hold timing pulses SHS and SHN in FIG. 15 are reversed in the upward and downward direction from those of the sample hold timing pulses SHS and SHN of FIG. 10. Furthermore, processes at steps S81, S82, S99 and S100 in the flow chart of FIG. 14 are similar to those at steps S51, S52, S69 and S70 in the flow chart of FIG. 14, respectively. Therefore, overlapping description of the processes is omitted herein to avoid redundancy.

In particular, at step S81, global resetting is carried out, and at step S82, accumulation of charge generated by photoelectric conversion by the photodiode PD is started.

At step S83, the system control section 115" generates a reset pulse RST and a first transfer pulse ROG to the reset pulse line RST and the first transfer pulse line ROG of all pixels, respectively, at a point of time when a predetermined exposure period elapses, for example, as seen from time t101 to time t102 of FIG. 15. Thereafter, the system control section 115" generates a second transfer pulse TRG to the second transfer pulse line TRG of all pixels at a timing immediately after the reset pulse RST and the first transfer pulse ROG, for example, as seen from time t103 to time t104 of FIG. 15.

As a result, the reset transistor TR_RST and the first transfer gate TR_ROG are placed into an on state in response to the reset pulse RST and the first transfer pulse ROG, respectively. Therefore, the charge accumulated in the photodiode PD is reset once. Thereafter, the charge as a reception light signal accumulated in the photodiode PD within an exposure period in response to the second transfer pulse TRG is transferred to the memory section MEM. In short, global transfer is carried out.

At step S84, the system control section 115" generates a discharge pulse OFG in the high level state, for example, as indicated at time t105 of FIG. 15. By this process, the charge remaining in the photodiode PD is discharged to the discharge drain line OFD to reset the photodiode PD.

At step S85, the system control section 115" resets a counter n for counting the number of rows to 1.

At step S86, the system control section 115" decides whether or not the time at present is a timing at which a discharge pulse OFG is to be generated in order to start an exposure period. If it is decided at step S86 that the time at present is not a timing at which a discharge pulse OFG is to be generated, then the processing advances to step S87.

At step S87, the system control section 115" determines the nth row as a processing object row and generates a reset pulse RST through the reset pulse line RST to the pixels of the processing object row. For example, in the case where the processing object row is the n−1th row, a reset pulse RST is generated within a period from time t201 to time t111 of FIG. 15. Consequently, the charge accumulated in the floating diffusion region FD is released to reset the floating diffusion region FD. Further, the system control section 115" generates a selection pulse SEL through the selection pulse line SEL. For example, in the case where the processing object row is the n−1th row, the system control section 115" generates a selection pulse SEL within a period from time t111 to time t118 of FIG. 15. Consequently, the vertical signal line VSL is rendered valid to allow the charge as a reception light signal to be transferred from the floating diffusion region FD. At this time, the system control section 115" simultaneously generates a sample hold timing pulse SHN to the column processing section 113. In particular, in the case where the processing object row is the n−1th row, a sample hold timing pulse SHN is generated with such a generation period of a selection pulse SEL as a period from time t112 to time t113 of FIG. 15.

At step S88, the column processing section 113 stores the reception light signal read out through the vertical signal line 117 (VSL) as information of the reset level in response to the sample hold timing pulse SHN. In other words, in the case of the unit pixels of the n−1th row, a reception light signal of the reset level is read out at a timing in the proximity of a period from time t112 to time t113 indicated by a broken line in FIG. 15.

At step S89, the system control section 115" generates a first transfer pulse ROG through the first transfer pulse line ROG to the pixels of the processing object row. In particular, for example, in the case where the processing object row is the n−1th row, a first transfer pulse ROG is generated within a period from time t114 to time t115 which is an intermediate timing of the generation period of the selection pulse SEL. By this process, the charge as a reception light signal accumulated in the memory section MEM of the pixels of the processing object row is transferred to the floating diffusion region FD. Further, the system control section 115 generates a sample hold timing pulse SHS to the column processing section 113. In particular, in the case where the processing object row is the n−1th row, a sample hold timing pulse SHS is generated within the generation period of the selection pulse SEL such as a period from time t116 to time t117.

At step S90, the column processing section 113 stores the reception light signal supplied thereto from the vertical signal line 117 (VSL) as information of the signal level in response to the sample hold timing pulse SHS. In particular, in the case where the processing object row is the n−1th row, a reception light signal of the signal level is read out at a timing in the proximity of a period from time t116 to time t117 indicated by a broken line in FIG. 15.

At step S91, the column processing section 113 subtracts a value of the reception light signal of the reset level from the reception light signal of the signal level stored therein to determine a difference between them. Then, the column processing section 113 supplies the reception light signal as a signal level of each of the pixels in the row corresponding to the calculated difference successively at a timing at which the column is selected by the horizontal drive section 114 to the signal processing section 118.

At step S92, the system control section system control section 115" decides whether or not reading out for all rows is completed. For example, if some row which is not processed as yet remains, then the counter n is incremented by one at step S93, whereafter the processing returns to step S86. In other words, the processes at steps S86 to S98 are repeated until reception light signals of the light reception level and the reset level of the pixels of all rows are read out and the difference between the reception light signals is stored as a signal level.

If it is decided at step S92 that the reception light signals of the pixels of all rows are read out, then the processing advances to step S99.

At step S99, the signal processing section 118 outputs the reception light signals as pixel information for one image.

At step S100, the system control section system control section 115" decides whether or not an instruction to end the operation is received. If it is decided that an instruction to end the operation is not received, then the processing returns to step S83. On the other hand, if it is decided at step S88 that, for example, an operating unit not shown is operated to issue an instruction to end the operation, and then the processing is ended.

On the other hand, if it is decided at step S86 that the time at present is a timing at which, for example, a discharge pulse OFG is to be generated, then the processing advances step S94.

At step S94, the system control section 115" determines the dummy column 111a as a processing object row and generates a reset pulse RST to the pixels of the dummy row through the reset pulse line RST. For example, in the case where an exposure period is started at a timing after processing of the n−1th row, the system control section 115" generates a reset pulse RST to the dummy row within a period from time t202 to time t119 illustrated in FIG. 15. Consequently, the charge as a reception light signal accumulated in the floating diffusion region FD in the dummy row is released to reset the floating diffusion region FD. However, since the photodiode PD in the dummy row does not carry out photoelectric conversion, the reception light signal accumulated in the floating diffusion region FD is ideally zero. At this time, the system control section 115" simultaneously generates a sample hold timing pulse SHS to the column processing section 113. In particular, a sample hold timing pulse SHN is generated with such a generation period of a selection pulse line SEL as a period from time t120 to time t121 of FIG. 15.

At step S95, the system control section 115" generates a discharge pulse OFG of the low level through the discharge pulse line OFG at time t120, for example, as seen in FIG. 15 to all pixels.

At step S96, the gate electrode of the discharge transistor TR_OFG of all pixels is placed into an off state in response to the discharge pulse OFG of the low level thereby to establish a state in which charge is accumulated as a reception light signal of the photodiode PD of all pixels. Consequently, an exposure time period is started.

At step S97, the column processing section 113 stores the reception light signal supplied thereto though the vertical signal line 117 (VSL) as information of the reset level in response to the sample hold timing pulse SHN. In particular, in the case where an exposure period is to be started at the next timing of the n−1th row, the reception light signal of the signal reset level is read out at a timing in the proximity of the period from time t120 to time t121 indicated by a broken line in FIG. 15.

At step S98, the system control section 115" generates a first transfer pulse ROG through the first transfer pulse line ROG to the pixels of the dummy column 111a which is the processing object row. For example, in the case where an exposure period is to be started at a timing after the process for the n−1th row, the system control section 115" generates a first transfer pulse ROG to the dummy row within a period from time t122 to time t123 of FIG. 15. Consequently, charge accumulated in the memory section MEM in the dummy row is transferred to the floating diffusion region FD. However, since the photodiode PD in the dummy row does not carry out photoelectric conversion, the charge accumulated in the memory section MEM is ideally zero, and therefore, also the reception light signal transferred to the floating diffusion region FD is zero ideally. At this time, the system control section 115'' simultaneously generates a sample hold timing pulse SHS to the column processing section 113. In particular, to the pixels of the dummy row, the system control section 115'' generates a sample hold timing pulse SHS within such a generation period of a selection pulse SEL as a time period from time t124 to time t125 of FIG. 15. Thereafter, the processing advances to step S90.

Then at step S90, the column processing section 113 stores the reception light signal supplied thereto through the vertical signal line 117 (VSL) as information of the signal level in response to the sample hold timing pulse SHS. In particular, in the case where an exposure period is to be started at a timing next to the n−1th row, the reception light signal of the signal level is read out at a timing within a time period from time t124 to time t125 indicated by a broken line in FIG. 15.

At step S91, the column processing section 113 subtracts the value of the reception light signal of the reset level from the reception light signal of the signal level stored therein to calculate the difference. Then, the column processing section 113 supplies the reception light signal as a signal level of each of the pixels in the row corresponding to the calculated difference successively at a timing at which the column is selected by the horizontal drive section 114 to the signal processing section 118.

By such processes as described above, it becomes possible to minimize the power supply variation and consequently reduce noise similarly as in the case of the CMOS image sensor 100 of FIG. 3. Further, since the reception light signal of the reset level is read out first and then the reception light signal of the signal level is read out, a dispersion of the reset level caused by the magnitude of the signal level can be reduced. Consequently, the CMOS image sensor 100 of FIG. 11 can measure the signal level with a higher degree of accuracy than the CMOS image sensor 100 of FIG. 3, and reduction of noise can be achieved with a higher degree of accuracy.

It is to be noted that, after the reading out of the dummy row comes to an end, processing for the nth row is to be stated, and therefore, a reset pulse RST for the nth row is generated within a period from time t203 to time t127 as seen in FIG. 15. Thereafter, a selection pulse SEL is generated within a period from time t127 to time t134. Meanwhile, a sample hold timing pulse SHN is generated within a period from time t128 to time t129, and a first transfer pulse ROG is generated within a period from time t130 to time t131 to read out the reset level of the pixels of the nth row. Further, in the proximity of a period from time t132 to time t133, a sample hold timing pulse SHS is generated to read out the signal level of the pixels of the nth row.

Then, after the processing for the nth row comes to an end, since processing for the n+1th row is to be started, a reset pulse RST for the n+1h row is generated within a period from time t204 to time t135. Thereafter, a selection pulse SEL is generated within a period from time t135 to time t142. Meanwhile, a sample hold timing pulse SHN is generated within a period from time t136 to time t137 to read out the reset level of the pixels of the n+1th row. Further, a first transfer pulse ROG is generated within a period from time t138 to time t139, and within a period from time t140 to time t141, a sample hold timing pulse SHS is generated to read out the signal level of the pixels of the n+1th row.

In particular, by the processing described above, at a timing at which a discharge pulse OFG is generated to turn off the discharge transistor TR_OFG, a process similar to the reading out process in a unit of a row is executed for the dummy row which does not contribute to image display. Therefore, reading out at a timing at which an influence of noise is liable to be had can be prevented, and as a result, generation of noise can be reduced. Further, since the reception light signal of the reset level is read out first and then the reception light signal of the signal level is read out, a dispersion of the reset level caused by the signal level can be suppressed. Consequently, since the signal level can be read out with a higher degree of accuracy, the influence of noise can be further reduced.

It is to be noted that, in the foregoing description, when the discharge pulse OFG is set to the low level to turn off the discharge transistor TR_OFG, the reception light signal of the signal level is read out after the reception light signal of the reset level of the pixels of the dummy row is read out. However, even if the dummy row 111a is not provided as in the case of the CMOS image sensor 100 of FIG. 8 and, after the reception light signal of the reset level of the pixels of the row from which the reception light signal is read out already is read out, the reception light signal of the signal level is read out, similar effects can be anticipated.

Outputting Process

Figure 16:
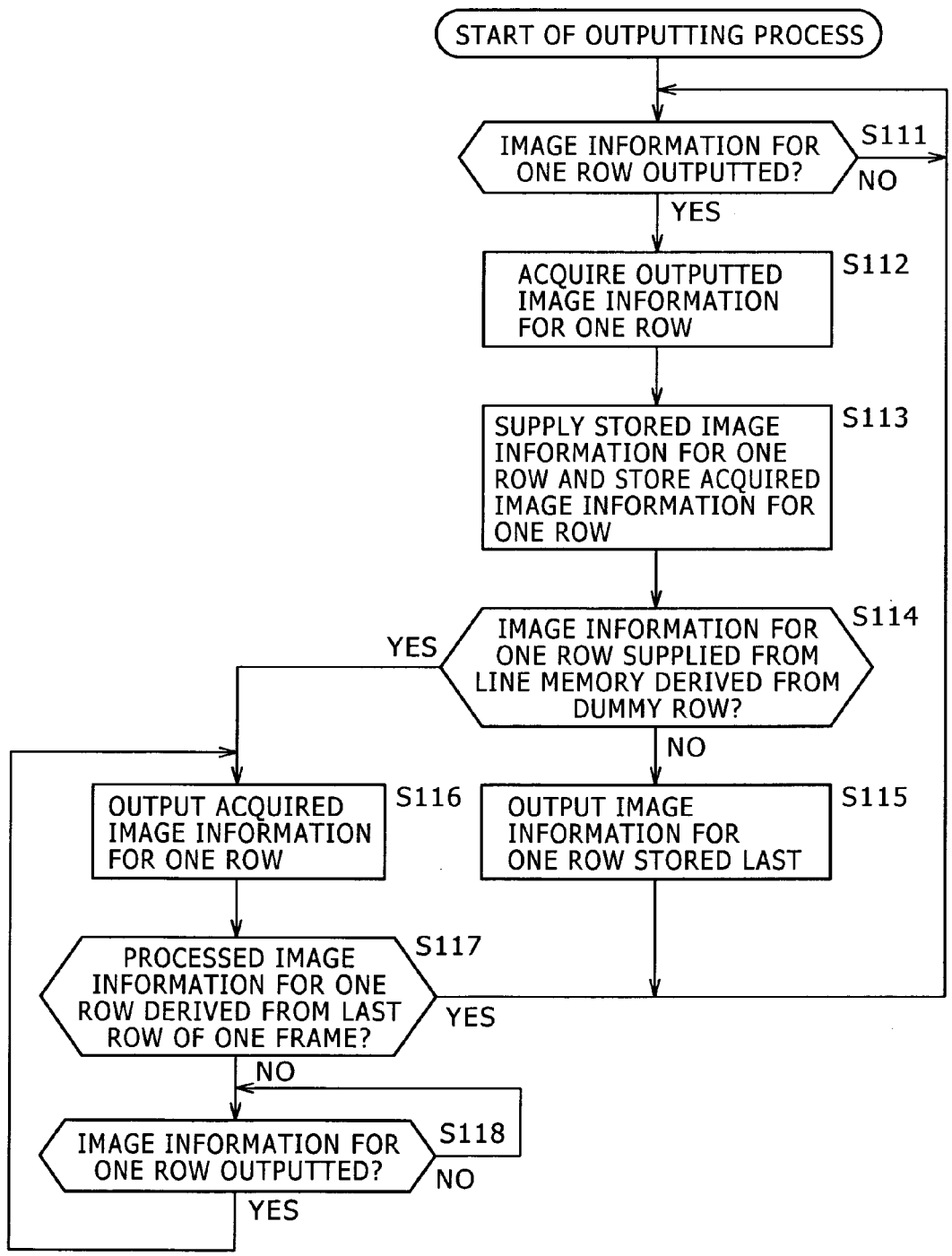
FIGS. 16 and 17 are a flow chart and a diagrammatic view, respectively, illustrating an outputting process of the CMOS image sensor of FIG. 11.

Now, an outputting process by the line memory 101 and the selector 102 of the CMOS image sensor 100 of FIG. 11 is described with reference to a flow chart of FIG. 16. It is assumed that the signal processing section 118 carries out signal processing of reception light signals successively read out from the column processing section 113 to generate pixel signals and outputs image information formed from the generated pixel signals successively in a unit of a row to the line memory 101 and the selector 102. Thereupon, the image information in a unit of a row includes address information for designating the number of each row. In the case of the dummy row, the image information includes address information representing that the image information is that of the dummy row.

At step S111, the selector 102 decides whether or not image information for one row is outputted from the signal processing section 118 and repeats a similar process until after it is decided that image information for one row is outputted from the signal processing section 118. For example, within a period from time t301 to time t302 in a timing chart of FIG. 17, if it is decided that image information for one row of the n−1th row is outputted from the signal processing section 118, then the processing advances to step S112. It is to be noted that, in FIG. 17, waveforms of time indicative of a timing of a row period, an output signal of the signal processing section 118, an output signal of the line memory 101, a selector selection signal representative of whether a selection signal selected by the selector 102 is the line memory 101 side or the signal processing section 118 side and an output signal of the selector 102 are illustrated in order from above.

At step S112, the line memory 101 and the selector 102 acquire image information for one row supplied thereto. For example, within the period from time t301 to time t302 of FIG. 17, the line memory 101 and the selector 102 acquire image information for one row of the n−1th row from the signal processing section 118.

At step S113, the line memory 101 supplies image information for one row of the immediately preceding row stored therein to the selector 102 and stores the acquired new image information for one row. In particular, for example, within the period from time t301 to time t302 of FIG. 17, the line memory 101 outputs the image information for one row of the n−2th row having been stored therein till then and stores the image information for one row of the n−1th row acquired from the signal processing section 118.

At step S114, the selector 102 decides based on the address information of the image information for one row supplied thereto from the line memory 101 whether or not the image information for one row supplied thereto from the line memory 101 is image information of the dummy row.

Figure 17:
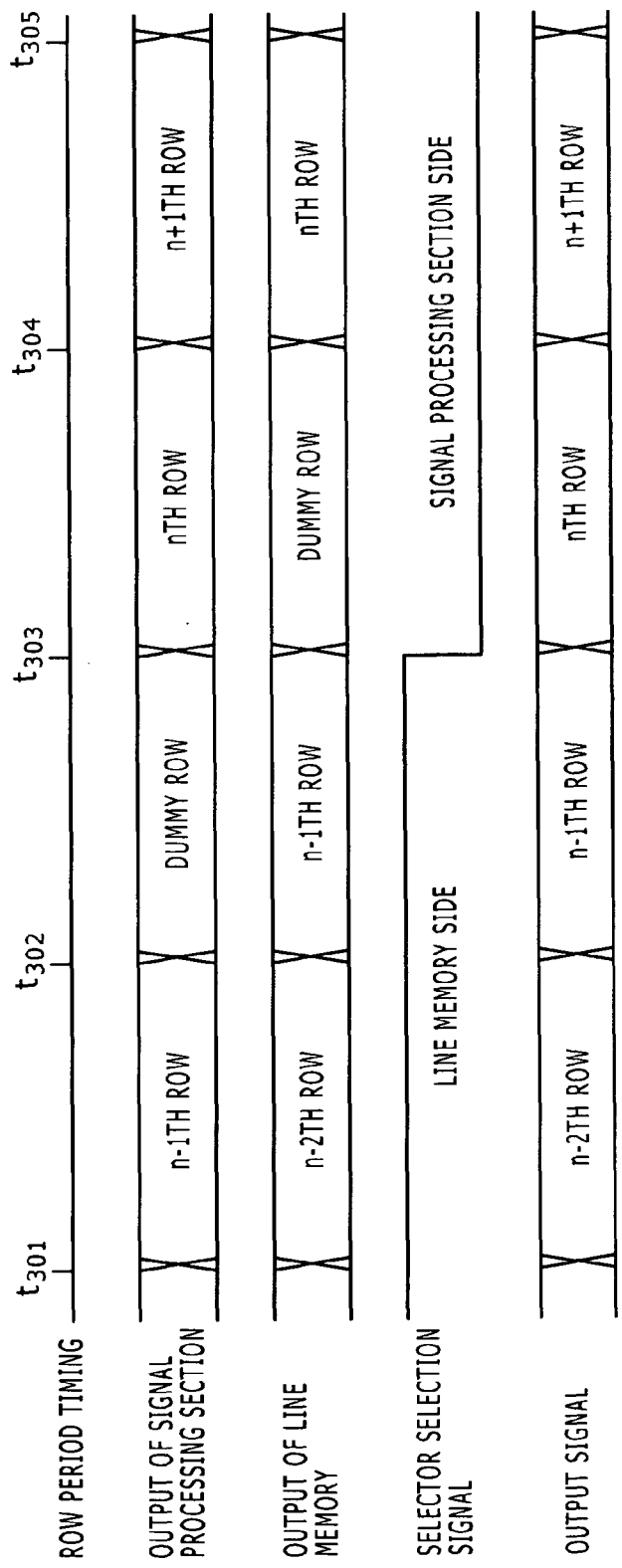

For example, in the case of the period from time t301 to time t302 of FIG. 17, the image information for one row supplied from the line memory 101 is image information for one row of the n−2th row but is not image information of the dummy row. Accordingly, in this instance, the processing advances from step S114 to step S115. On the other hand, in the case of a period from time t302 to time t303 of FIG. 17, the image information for one row supplied thereto from the line memory 101 is image information for one row of the n−1th row but is not image information of the dummy row. Also in this instance, the processing advances to step S115.

At step S115, the selector 102 abandons the image information for one row outputted from the signal processing section 118 and outputs the image information for one row of the immediately preceding row supplied from the line memory 101. Then, the processing returns to step S111. In particular, in the case of the period from time t301 to time t302 of FIG. 17, the selector 102 outputs the image information for one row of the n−2th row supplied thereto from the line memory 101. On the other hand, in the case of the period from time t302 to time t303, the selector 102 outputs the image information for one row of the n−1th row supplied thereto from the line memory 101.

On the other hand, for example, in the case of the period from time t303 to time t304 of FIG. 17, the image information for one row supplied thereto from the line memory 101 is image information for one row of the dummy row. In this instance, the processing advances to step S116.

At step S116, the selector 102 abandons the image information supplied thereto from the line memory 101 and outputs the acquired image information for one row outputted from the signal processing section 118. In particular, in the case of the period from time t303 to time t304 of FIG. 17, the selector 102 outputs the image information for one row of the nth row outputted from the signal processing section 118.

At step S117, the selector 102 decides from the address information of the image information for one row outputted by the process at step S116 whether or not the outputted image information for one row is image information of the last row of an image for one frame.

If it is decided at step S117 that the outputted image information for one row is not image information of the last row, then the processing advances to step S118.

At step S118, the selector 102 decides whether or not image information for one row is outputted from the signal processing section 118 and repeats a similar process until after image information for one row is outputted from the signal processing section 118. Then, if it is decided at step S118 that, for example, image information of an image for one frame is outputted, then the processing returns to step S116, at which the image information for one row acquired from the signal processing section 118 is outputted as it is. In other words, in the case of the period from time t304 to time t305, the selector 102 outputs the image information for one row of the n+1th row outputted from the signal processing section 118.

On the other hand, if it is decided at step S117 that the outputted image information for one row is image information of the last row, then the processing returns to step S111.

By the processes described above, before image information of the dummy row is received, image information acquired at a timing preceding by one row interval is outputted from the line memory 101. Then, if image information of the dummy row is received, then the image information for one row outputted from the signal processing section 118 is outputted as it is. As a result, even if image information of the dummy row is received, an image for one frame can be outputted successively and continuously in a unit of a row.

It is to be noted that, in the foregoing description, in the case where image information of the dummy row is sent from the line memory 101, the selector 102 abandons image information for one row supplied thereto from the line memory 101 and outputs image information for one row outputted from the signal processing section 118. However, in the case where image information which does not contribute to image display is received, only it is necessary to allow image information for one row outputted from the signal processing section 118 to be outputted. Therefore, the CMOS image sensor 100 of FIG. 8 may be used such that, in the case of an image information read out again after it is read out already in place of image information of the dummy row, image information from the signal processing section 118 is outputted similarly.

<4. Fourth Embodiment>

Other Examples of a Configuration of a Unit Pixel

The present invention can be applied not only to such configurations of a unit pixel as described hereinabove but also to various other configurations of a unit pixel. In the following, structures of a unit pixel to which an embodiment of the present invention can be applied are described.

The unit pixel 120 can be structured such that it includes, separately from a floating diffusion region or capacitance, also called floating diffusion, a charge retaining region, hereinafter referred to as memory section, for retaining or accumulating photocharge transferred from a photoelectric conversion device.

Figure 18:
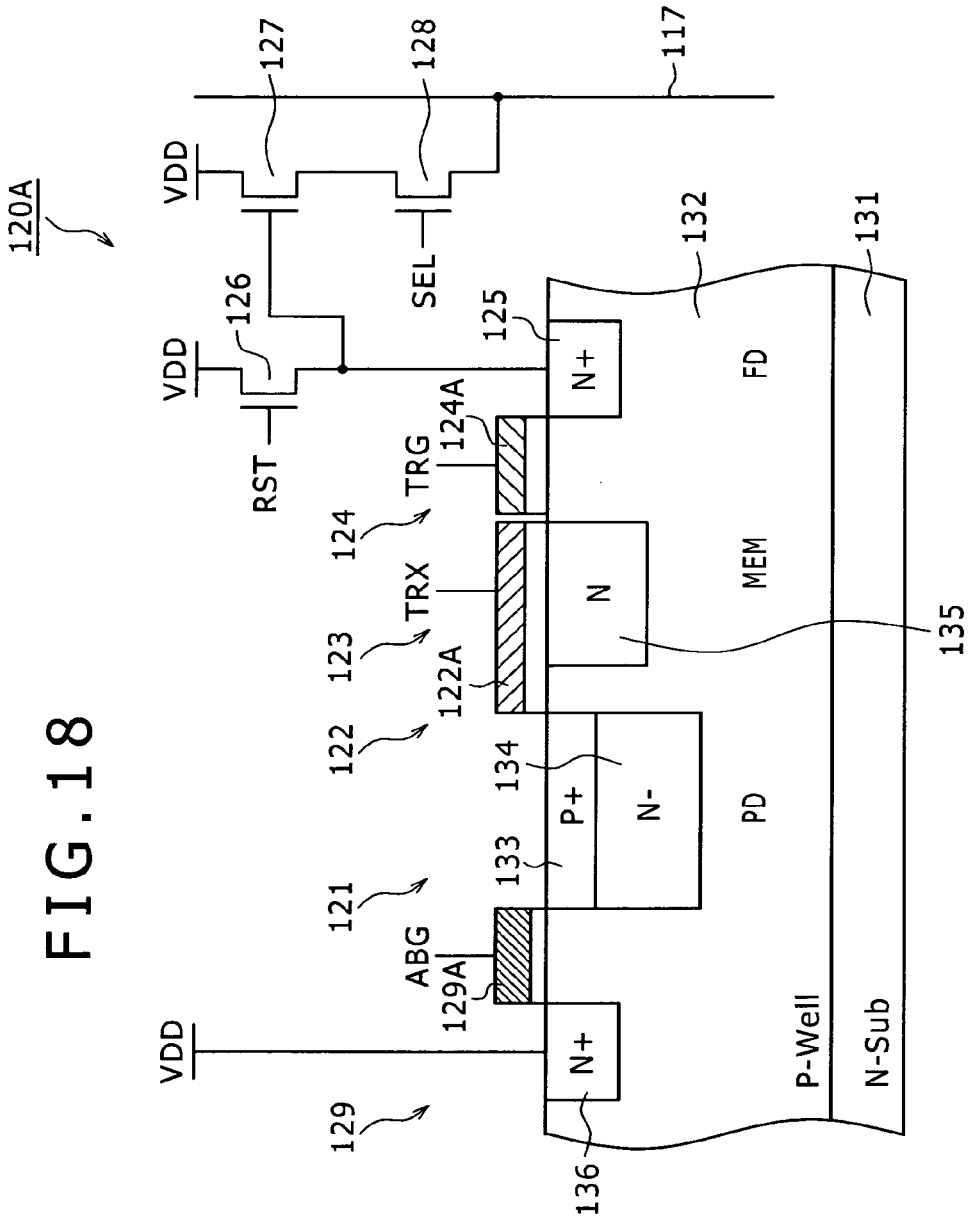
FIG. 18 is a schematic view showing a different configuration example of a different unit pixel.

FIG. 18 is a view showing a configuration of a unit pixel 120A which is an example of a configuration of the structure of the unit pixel 120.

Referring to FIG. 18, the unit pixel 120A includes, for example, a photodiode (PD) 121 as a photoelectric conversion element. The photodiode 121 is an embedded type photodiode formed, for example, by forming, on a P-type well layer 132 formed on an N-type substrate 131, a P-type layer 133 on the substrate surface side to embed an N-type embedded layer 134 in the P-type well layer 132.

The unit pixel 120A includes, in addition to the photodiode 121, a first transfer gate 122, a memory section (MEM) 123, a second transfer gate 124, and a floating diffusion region (FD: Floating Diffusion) 125. It is to be noted that the memory section 123 and the floating diffusion region 125 block light.

The first transfer gate 122 transfers charge generated by photoelectric conversion by and accumulated in the photodiode 121 in response to a transfer pulse TRX applied to the gate electrode 122A thereof. The memory section 123 is formed from an N-type embedded channel 135 formed below the gate electrode 122A and accumulates charge transferred from the photodiode 121 by the first transfer gate 122. Since the memory section 123 is formed from the embedded channel 135, generation of dark current on the Si—SiO$_2$ interface can be suppressed, which can contribute to improvement in picture quality.

By disposing the gate electrode 122A at an upper portion of the memory section 123 and applying a transfer pulse TRX to the gate electrode 122A, modulation can be applied to the memory section 123. In particular, when a transfer pulse TRX is applied to the gate electrode 122A, the potential of the memory section 123 becomes deep. Consequently, the saturation charge amount of the memory section 123 can be increased from that in the case where no modulation is applied.

The second transfer gate 124 transfers charge accumulated in the memory section 123 in response to a transfer pulse TRG applied to the gate electrode 124A thereof. The floating diffusion region 125 is a charge voltage conversion section formed from an N-type layer and converts charge transferred thereto from the memory section 123 by the second transfer gate 124 into a voltage.

The unit pixel 120A further includes a reset transistor 126, an amplification transistor 127 and a selection transistor 128. The reset transistor 126, amplification transistor 127 and selection transistor 128 are formed, for example, in the example of FIG. 18, using an N-channel MOS transistor. However, the combination of conduction types of the reset transistor 126, amplification transistor 127 and selection transistor 128 is a mere example, and the combination is not limited to this.

The reset transistor 126 is connected between a power supply VDD and the floating diffusion region 125 such that it resets the floating diffusion region 125 when a reset pulse RST is applied to the gate electrode thereof. The amplification transistor 127 is connected at the drain thereof to the power supply VDD and at the gate thereof to the floating diffusion region 125, and reads out the voltage of the floating diffusion region 125.

The selection transistor 128 is connected, for example, at the drain electrode thereof to the source electrode of the amplification transistor 127 and at the source electrode thereof to the vertical signal line 117. Thus, when a selection pulse SEL is applied to the gate electrode of the selection transistor 128, the selection transistor 128 selects a unit pixel 120A from which a pixel signal is to be read out. It is to be noted that the selection transistor 128 may adopt another configuration wherein it is connected between the power supply VDD and the drain electrode of the amplification transistor 127.

It is to be noted that, as regards the floating diffusion region 125, reset transistor 126 and amplification transistor 127, it is possible to omit one or plural ones of them depending upon a reading out method of a pixel signal or to use one or plural ones of them commonly between a plurality of pixels.

The unit pixel 120A further includes a charge discharging section 129 for discharging accumulated charge of the photodiode 121. In particular, the charge discharging section 129 discharges charge of the photodiode 121 to the drain portion 136 of an N-type layer in response to a control pulse ABG applied to the gate electrode 129A thereof upon starting of exposure. The charge discharging section 129 further acts to prevent such a situation that, during a reading out period after an end of exposure, the photodiode 121 is saturated and charge overflows. The power supply VDD is applied to the drain portion 136.

Further, the unit pixel 120A is configured such that it includes the charge discharging section 129 in order to prevent discharge of accumulated charge of the photodiode 121 and overflowing of charge from the photodiode 121. In contrast, even if another configuration wherein all of the transfer pulses TRX and TRG and the reset pulse RST are placed into an active state, in the present example, into the "H" level state, is adopted, similar working effects to those of the charge discharging section 129 can be achieved.

Here, the potential of the gate electrode of the memory section 123 as a charge retaining region, that is, of the gate electrode 122A of the first transfer gate 122, is described.

In the present embodiment, the potential of the gate electrode of the memory section 123 as a charge retaining region is set to a potential for establishing a pinning state within a period within which at least one of the first transfer gate 122 and the second transfer gate 124, for example, the first transfer gate 122, is placed into a non-conducting state. More particularly, the potential of the gate electrode of the memory section 123 is set so as to establish a pinning state in which carries can be accumulated into the Si surface immediately below the gate electrode with the voltages to be applied to the gate electrodes 122A and 124A when one or both of the first transfer gate 122 and the second transfer gate 124 are placed into a non-conducting state.

In the case where the transistor which forms a transfer gate is an N-type transistor as in the present embodiment, when the first transfer gate 122 is placed into a non-conducting state, the voltage to be applied to the gate electrode 122A is set to a voltage with which it exhibits a negative potential lower than the ground GND with respect to the P-type well layer 132. It is to be noted that, though not shown, in the case where the transistor which forms a transfer gate is a P-type transistor, the P-type well layer changes to an N-type well layer, and the voltage is set to a voltage higher than the power supply VDD with respect to the N-type well layer.

The reason why, when the first transfer gate 122 is placed into a non-conducting state, the voltage to be applied to the gate electrode 122A is set to a voltage for establishing a pinning state in which carriers can be accumulated in the Si surface immediately below the gate electrode is such as described below.

If the potential of the gate electrode 122A of the first transfer gate 122 is set to a potential (for example, 0 V) equal to that of the P-type well layer 132, then carriers generated from lattice defects of the Si surface are accumulated in the memory section 123 and may flow as dark current and possibly deteriorate the picture quality. Therefore, in the present embodiment, the off potential of the gate electrode 122A formed on the memory section 123 is set to a negative potential, for example, to $-2.0$ V with respect to the P-type well layer 132. Consequently, in the present embodiment, it is possible to generate, during a charge retaining period, holes in the Si surface of the memory section 123 and cause electrons generated in the Si surface to re-couple to the holes. As a result, the dark current can be reduced.

It is to be noted that, since, in the configuration of FIG. 18, the gate electrode 124A of the second transfer gate 124 exists at an end portion of the memory section 123, it is possible to similarly suppress dark current to be generated at an end portion of the memory section 123 by setting also the gate electrode 124A to a negative potential.

The CMOS image sensor 100 starts exposure simultaneously for all pixels and ends the exposure simultaneously for all pixels, and charge accumulated in the photodiode 121 is transferred to the memory section 123 and the floating diffusion region 125, which are blocked against light, to implement global exposure. By this global exposure, imaging based on an exposure period which is uniform to all pixels and free from distortion can be achieved.

It is to be noted that all pixels in the present embodiment are all of those pixels in a portion which appears on an image and include the dummy pixels and so forth. Further, if the time difference or the distortion of an image is sufficiently small to such a degree that it does not matter, then the simultaneous exposure of all pixels include exposure by high speed scanning for each of a plurality of rows, for example, for each several tens of rows.

It is to be noted that the photodiode 121, first transfer gate 122, memory section (MEM) 123, second transfer gate 124 and floating diffusion region (FD: Floating Diffusion) 125 in FIG. 18 correspond to the photodiode PD, second transfer gate TR_TRG, floating diffusion region FD2, first transfer gate TR_ROG and floating diffusion region FD of FIG. 12, respectively, and similar working effects are exhibited by corresponding operations.

First Different Configuration Example of the Unit Pixel

The present invention can be adopted also by structures of unit pixels other than the unit pixels described hereinabove in connection with the embodiments. In the following, other different structures of a unit pixel to which the present invention can be applied are described.

Figure 19:
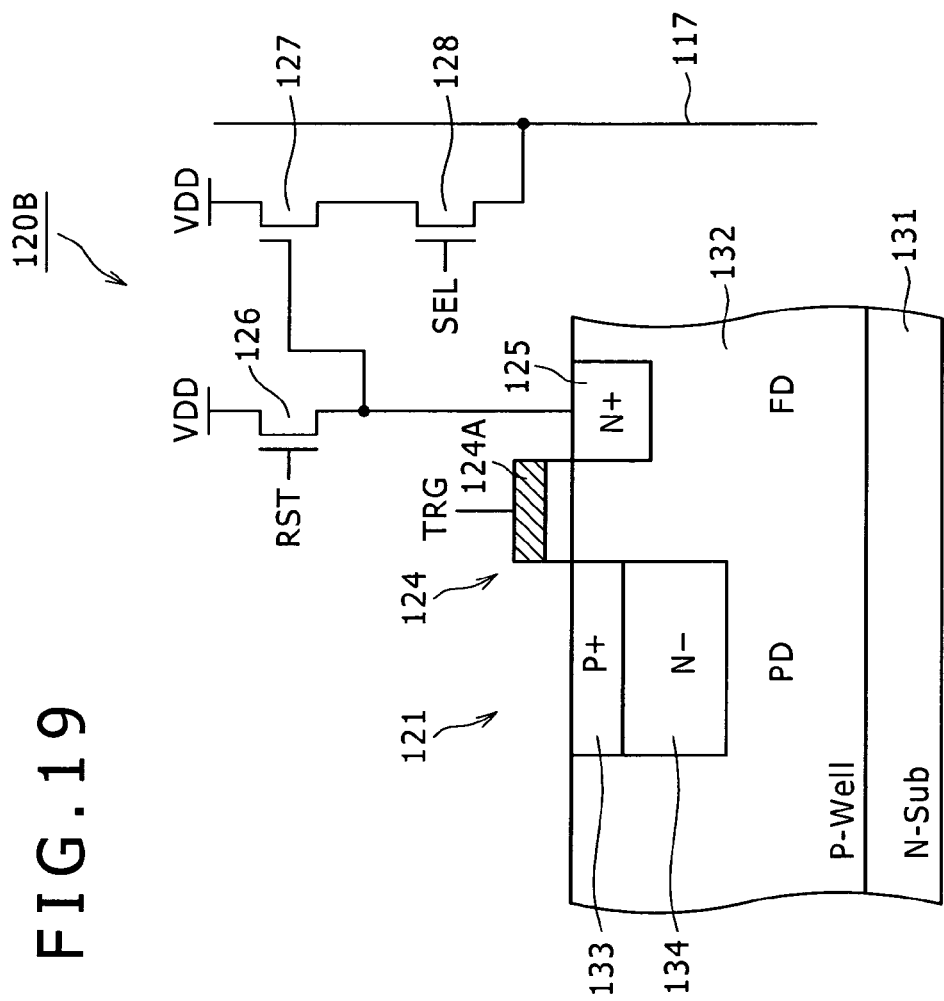
FIGS. 19, 20, 21, 22 and 23 are similar views but showing first, second, third, fourth and fifth different configuration example of a different unit pixel, respectively.

FIG. 19 is a view showing a structure of a unit pixel 120B which is a first different configuration example of the unit pixel 120.

The unit pixel 120B is different from the unit pixel 120A of FIG. 18 in that the first transfer gate 122 and the memory section 123 of the unit pixel 120A of FIG. 18 are omitted and the photodiode 121 and the floating diffusion region 125 are disposed adjacent each other across the P-type well layer 132. The second transfer gate 124 is disposed on the upper side of the P-type well layer 132 between the photodiode 121 and the floating diffusion region 125.

A global exposure operation of the unit pixel 120B is described. First, a charge discharging operation of discharging accumulated charge of the photodiode 121 simultaneously with regard to all pixels is executed, and then exposure is started. Consequently, photocharge is accumulated into the PN junction capacitance of the photodiode 121. At a point of time of an end of the exposure period, the second transfer gate 124 is turned on simultaneously with regard to all pixels so that all of the accumulated photocharge is transferred to the floating diffusion region 125. Then, the second transfer gate 124 is closed so that the photocharge accumulated within the exposure period which is equal with regard to all pixels is retained by the floating diffusion region 125. Thereafter, the photocharge retained in the floating diffusion region 125 is successively read out as an image signal through the vertical signal line 117. Finally, the floating diffusion region 125 is reset, and the reset level is read out.

It is to be noted that the photodiode 121, second transfer gate 124 and floating diffusion region (FD: Floating Diffusion) 125 correspond to the photodiode PD, first transfer gate TR_ROG and floating diffusion region FD of FIG. 4, respectively, and similar working effects are achieved by corresponding operations.

Second Different Configuration Example of the Unit Pixel

Figure 20:
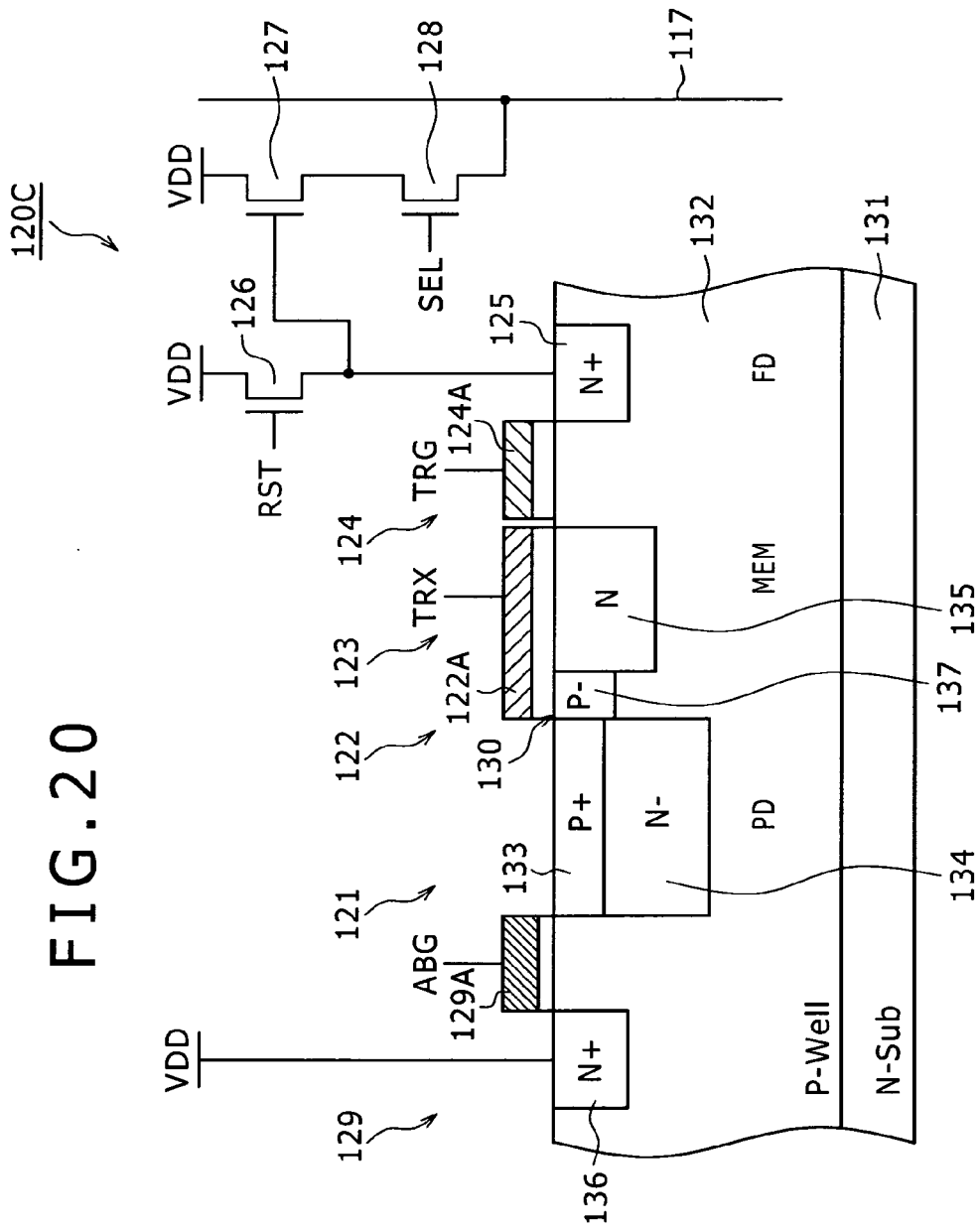

FIG. 20 is a view showing a structure of a unit pixel 120C which is a second different configuration example of the unit pixel 120.

The unit pixel 120C is different from the unit pixel 120A of FIG. 18 in that a P-impurity diffusion region 137 is provided at a boundary portion between the photodiode 121 and the memory section 123 below the gate electrode 122A so as to form an overflow path 130.

In order to form the overflow path 130, it is necessary to make the potential of the impurity diffusion region 137 low. The P-impurity diffusion region 137 can be formed by doping the impurity diffusion region 137 lightly with an N purity to lower the P impurity concentration. Or, in the case where a P impurity is doped into the impurity diffusion region 137 upon formation of a potential barrier, the P-impurity diffusion region 137 can be formed by lowering the concentration of the P impurity.

In the unit pixel 120C, the overflow path 130 formed at the boundary portion between the photodiode 121 and the memory section 123 is used as a countermeasure for accumulating charge generated at a low illuminance preferentially in the photodiode 121.

In the case where the P-impurity diffusion region 137 is provided at the boundary portion between the photodiode 121 and the memory section 123, the potential at the boundary portion drops. The portion at which the potential drops makes the overflow path 130. Thus, charge generated in the photodiode 121 and exceeding the potential of the overflow path 130 automatically leaks to and is accumulated in the memory section 123. In other words, generated charge equal to or lower than the potential of the overflow path 130 is accumulated in the photodiode 121.

The overflow path 130 has a function as an intermediate charge transfer section. In particular, the overflow path 130 as an intermediate charge transfer section transfers charge, which is generated by photoelectric conversion by the photodiode 121 during an exposure period within which all of a plurality of unit pixels simultaneously carry out imaging operation and exceeds a predetermined charge amount which depends upon the potential of the overflow path 130, as signal charge to the memory section 123.

It is to be noted that, in the example of FIG. 20, the structure wherein the overflow path 130 is formed by providing the P-impurity diffusion region 137 is adopted. However, also it is possible to adopt another structure wherein an N-impurity diffusion region 137 is provided in place of provision of the P-impurity diffusion region 137 to form the overflow path 130.

It is to be noted that the photodiode 121, first transfer gate 122, memory section (MEM) 123, second transfer gate 124 and floating diffusion region (FD: Floating Diffusion) 125 in FIG. 20 correspond to the photodiode PD, second transfer gate TR_TRG, memory section MEM, first transfer gate TR_ROG and floating diffusion region FD of FIG. 12, respectively, and similar working effects are exhibited by corresponding operations.

Third Different Configuration Example of the Unit Pixel

Figure 21:
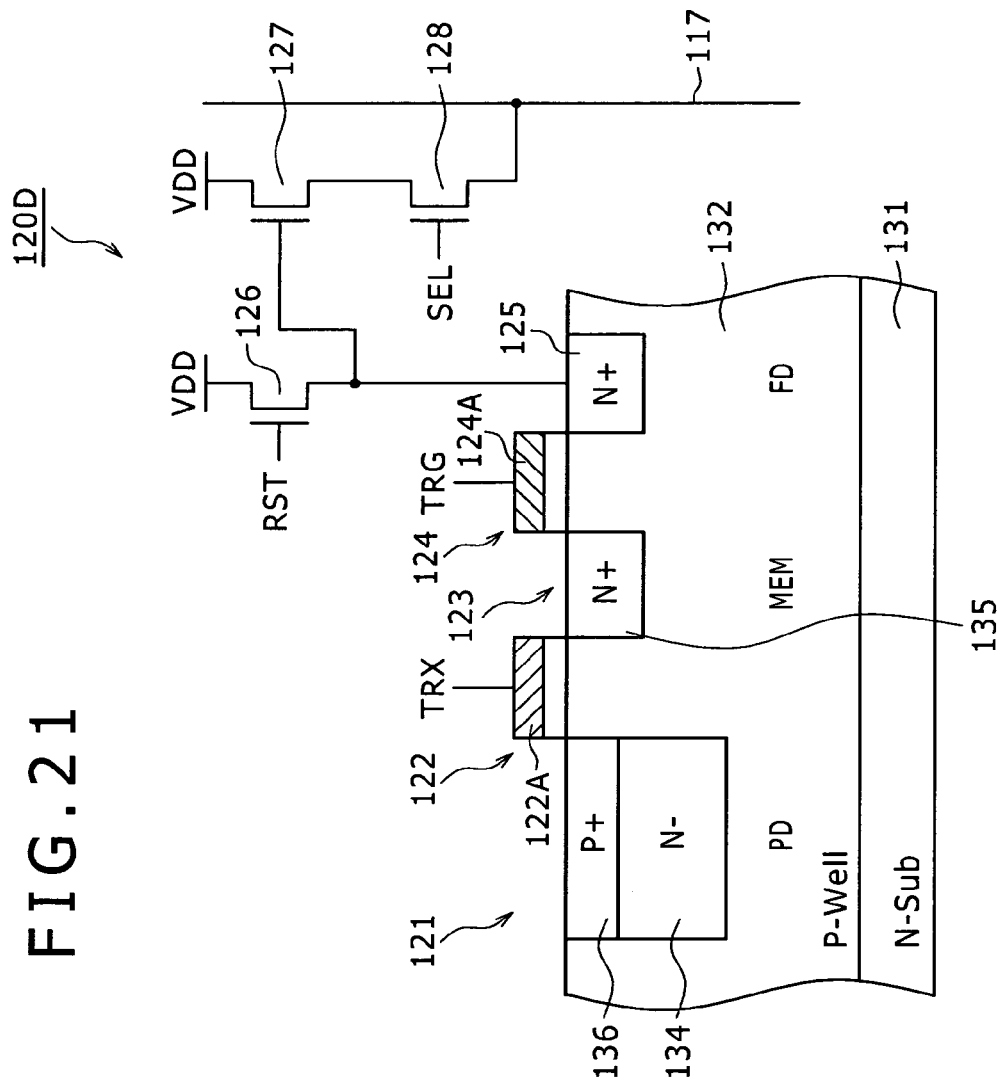

FIG. 21 is a view showing a structure of a unit pixel 120D which is a third different configuration example of the unit pixel 120.

The unit pixel 120D is different in configuration from the unit pixel 120B of FIG. 19 in that it additionally includes a memory section 123 similar to the floating diffusion region 125. In particular, in the unit pixel 120D, the gate electrode 122A of the first transfer gate 122 is provided at an upper portion of the P-type well layer 132 on the boundary of the photodiode 121 and the memory section 123. Further, in the unit pixel 120D, the memory section 123 is formed from an N-type layer 138 similar to the floating diffusion region 125.

A global exposure operation of the unit pixel 120D is executed in the following procedure. First, a charge discharging operation is executed simultaneously with regard to all pixels, and simultaneous exposure is started. Generated photocharge is accumulated in the photodiode 121. At a point of time of an end of the exposure, the first transfer gate 122 is turned on simultaneously with regard to all pixels, whereupon accumulated photocharge is transferred to and retained into the memory section 123. After the exposure comes to an end, the reset level and the signal level are read out successively. In particular, the floating diffusion region 125 is reset, and then the reset level is read out. Thereafter, the retained charge of the memory section 123 is transferred to the floating diffusion region 125 and the signal level is read out.

It is to be noted that the photodiode 121, first transfer gate 122, memory section (MEM) 123, second transfer gate 124 and floating diffusion region (FD: Floating Diffusion) 125 in FIG. 21 correspond to the photodiode PD, second transfer gate TR_TRG, memory section MEM, first transfer gate TR_ROG and floating diffusion region FD of FIG. 12, respectively, and similar working effects are exhibited by corresponding operations.

Fourth Different Configuration Example of the Unit Pixel

Figure 22:
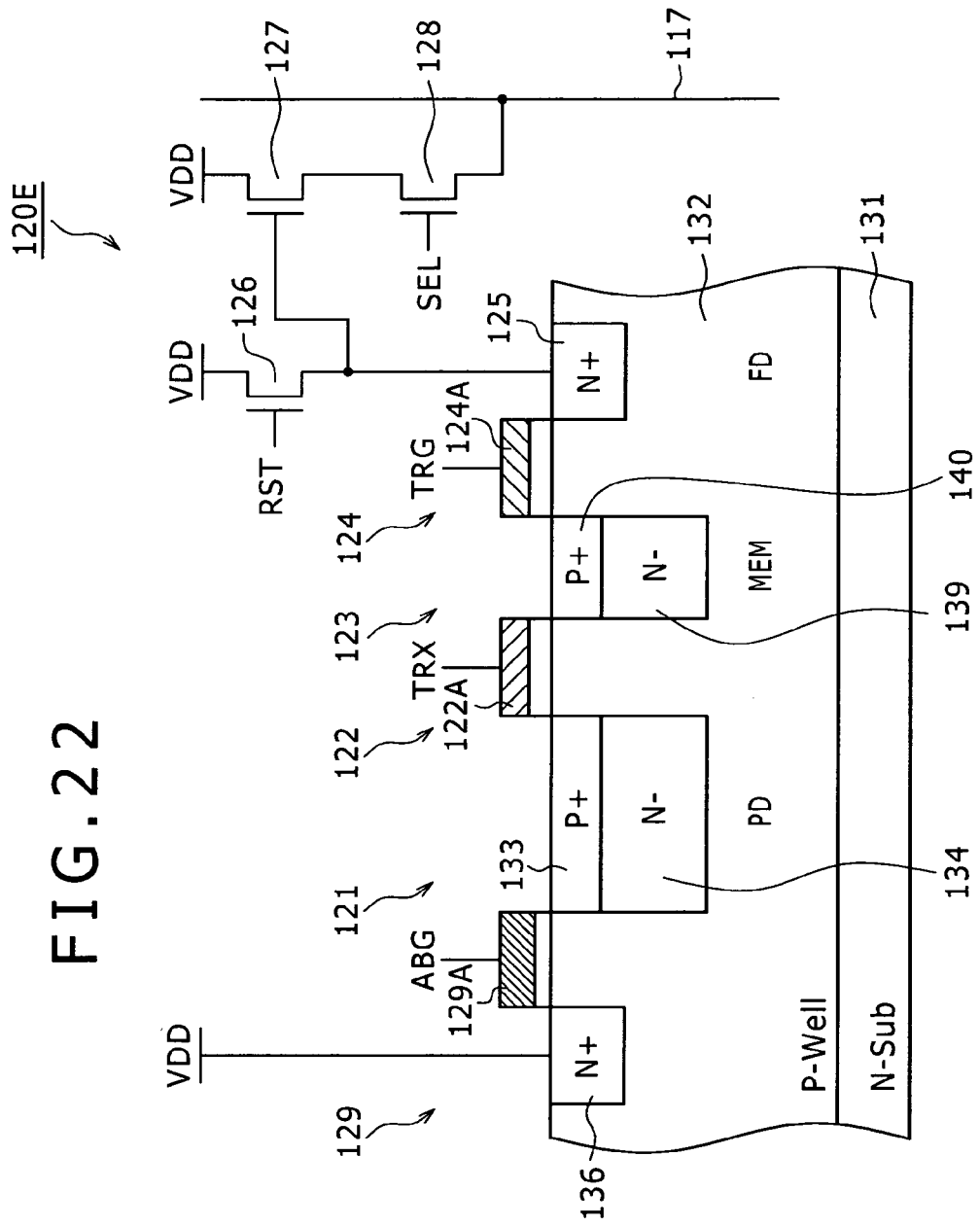

FIG. 22 is a view showing a structure of a unit pixel 120E which is a fourth different configuration example of the unit pixel 120.

In the unit pixel 120A of FIG. 20, the memory section 123 is formed from the embedded channel 135. In contrast, in the unit pixel 120E of FIG. 22, a configuration wherein the memory section 123 is formed from an N-type diffusion region 139 of the embedded type.

Also where the memory section 123 is formed from the N-type diffusion region 139, working effects similar to those in the case where the memory section 123 is formed from the embedded channel 135 can be achieved. In particular, by forming the N-type diffusion region 139 in the inside of the P-type well layer 132 and forming a P-type layer 140 on the substrate surface side, such a situation that dark current generated on the Si—SiO$_2$ interface is accumulated in the N-type diffusion region 139 of the memory section 123 can be prevented. Consequently, improvement in picture quality can be anticipated.

Preferably, the impurity concentration of the N-type diffusion region 139 of the memory section 123 is lower than that of the floating diffusion region 125. By such setting of the impurity concentration, the transfer efficiency of charge from the memory section 123 to the floating diffusion region 125 by the second transfer gate 124 can be raised. The global exposure operation of the unit pixel 120E is similar to that of the unit pixel 120A of FIG. 20.

It is to be noted that, while, in the configuration of the unit pixel 120E shown in FIG. 22, the memory section 123 is formed from the N-type diffusion region 139 of the embedded type, a structure wherein the memory section 123 is not formed in the embedded type may be adopted although dark current generated by the memory section 123 may sometimes increase.

Also in the configuration of the unit pixel 120E, it is possible to omit the charge discharging section 129 and adopt a configuration wherein all of the transfer pulses TRX and TRG and the reset pulse RST are placed into an active state similarly as in the case of the unit pixel 120A of FIG. 20. By adopting this configuration, working effects similar to those of the charge discharging section 129 can be achieved. In particular, it is possible to discharge charge of the photodiode 121 and release charge overflowing from the photodiode 121 within a reading out period to the substrate side.

It is to be noted that the photodiode 121, first transfer gate 122, memory section (MEM) 123, second transfer gate 124 and floating diffusion region (FD: Floating Diffusion) 125 in FIG. 22 correspond to the photodiode PD, second transfer gate TR_TRG, memory section MEM, first transfer gate TR_ROG and floating diffusion region FD of FIG. 12, respectively, and similar working effects are exhibited by corresponding operations.

Fifth Different Configuration Example of the Unit Pixel

Figure 23:
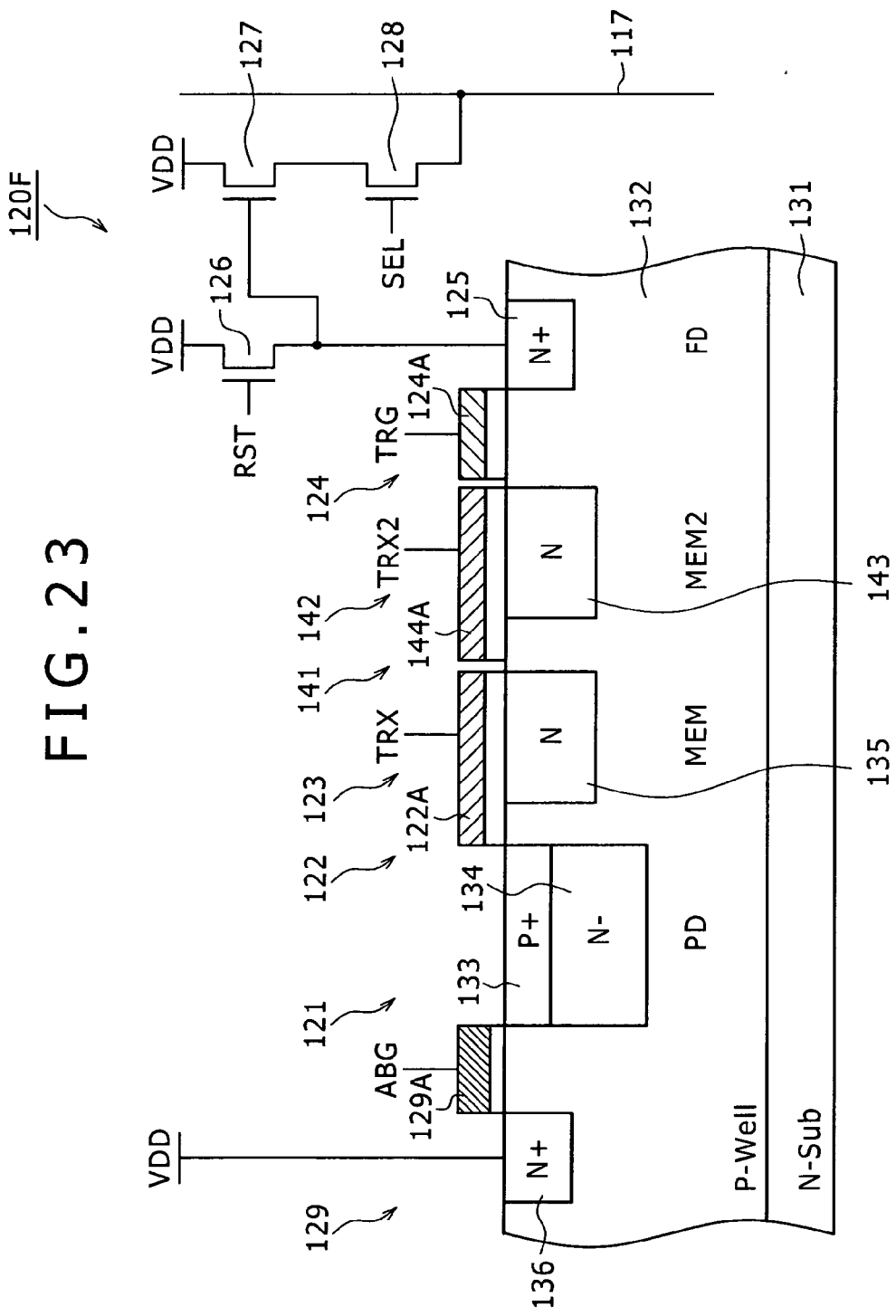

FIG. 23 is a view showing a structure of a unit pixel 120F which is a fifth different configuration example of the unit pixel 120.

While, in the unit pixel 120 of FIG. 20, one memory section (MEM) 123 is disposed between the photodiode 121 and the floating diffusion region 125, in the unit pixel 120F of FIG. 23, an additional memory section (MEM2) 142 is disposed. In other words, the memory section has a two-stage configuration.

The third transfer gate 141 transfers charge accumulated in the memory section 123 in response to a transfer pulse TRX2 applied to the gate electrode 141A thereof. The memory section 142 is formed from an N-type embedded channel 143 formed below the gate electrode 141A and accumulates charge transferred thereto from the memory section 123 by the third transfer gate 141. Since the memory section 142 is formed from the embedded channel 143, generation of dark current on the Si—SiO$_2$ interface can be suppressed, and consequently, improvement of the picture quality can be anticipated.

Since the memory section 142 is configured similarly to the memory section 123, if modulation is applied thereto, then similarly to the memory section 123, the saturation charge amount of the memory section 142 can be increased from that in the case where modulation is not applied.

In a global exposure operation of the unit pixel 120F, photocharge accumulated simultaneously in all pixels is retained by the photodiode 121 or the memory section 123. The memory section 142 is used to retain photocharge for a period of time until the pixel signal is read out.

It is to be noted that the photodiode 121, first transfer gate 122, memory section (MEM) 123, second transfer gate 124 and floating diffusion region (FD: Floating Diffusion) 125 in FIG. 23 correspond to the photodiode PD, second transfer gate TR_TRG, memory section MEM, first transfer gate TR_ROG and floating diffusion region FD of FIG. 12, respectively, and similar working effects are exhibited by corresponding operations.

The application of the present invention is not limited to a solid-state imaging device. In particular, the present invention can be applied generally to electronic apparatus which use a solid-state imaging device as an image capturing section or a photoelectric conversion section thereof such as an imaging apparatus of a digital still camera or a video camera, a portable terminal apparatus having an imaging apparatus such as a portable telephone set, a copying machine which uses a solid-state imaging device as an image reading section, and so forth. The solid-state imaging device may be formed as a one-chip device or may have a form of a module in which an imaging section and a signal processing section or an optical section are packaged collectively such that it has an imaging function.

It is to be noted that the conduction types of the device structure in the unit pixels 120, 120A to 120F described hereinabove are a mere example, and they may be reversed or exchanged between the N type and the P type. Also with regard to the conduction type of the N-type substrate 131, it may be any of the N type and the P type.

Further, while, in the foregoing description, the reading out operation or the like of the signal level is carried out in a unit of a row, it may not necessarily be carried out as a process for a unit of each row but may otherwise be carried out in a unit of a plurality of pixels or in a unit of a plurality of rows and a unit of a plurality of pixels.

<5. Fifth Embodiment>

Figure 24:
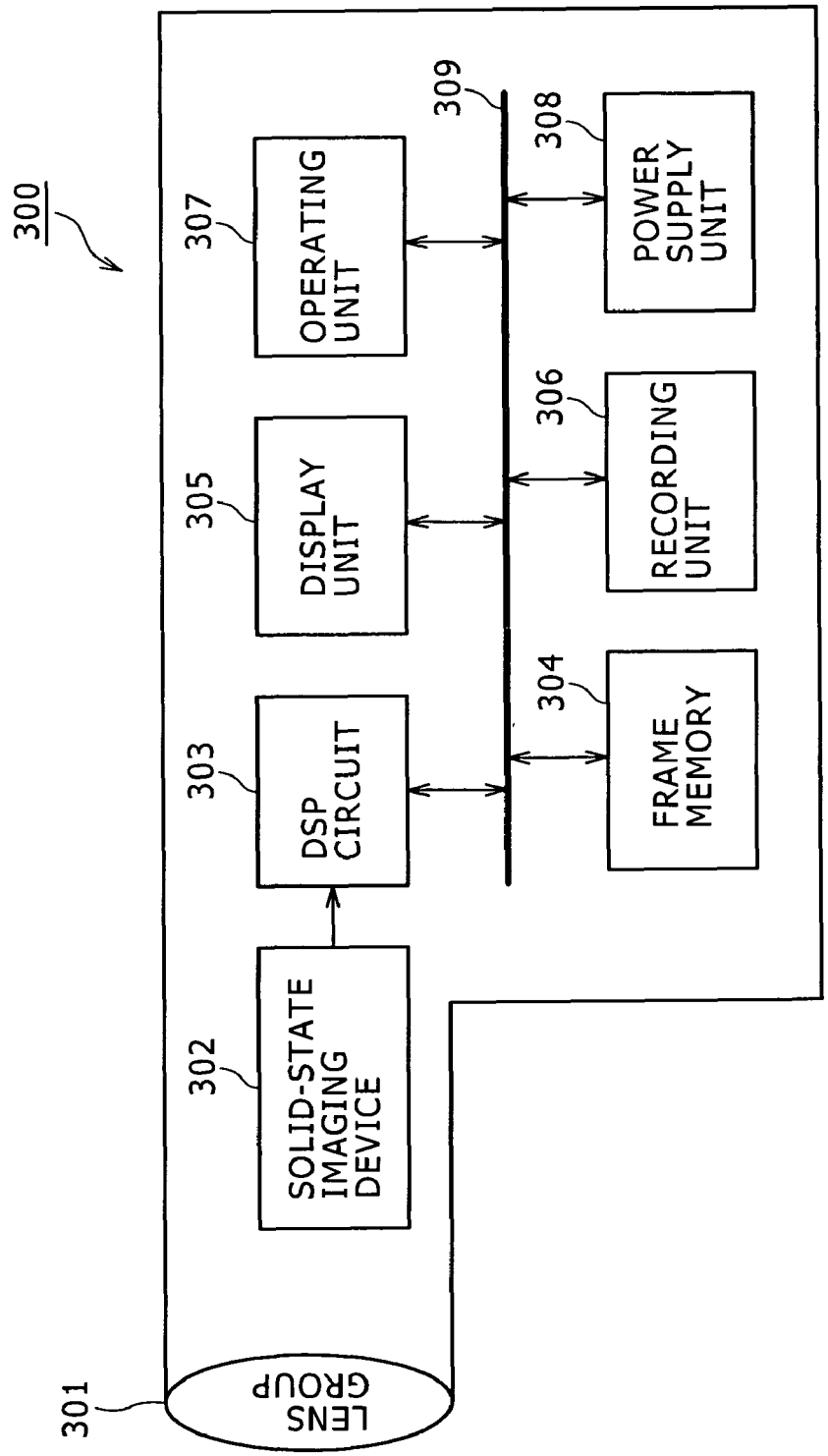
FIG. 24 is a block diagram showing an example of a configuration of an electronic apparatus which includes a CMOS image sensor to which the solid-state imaging device according to an embodiment of the present invention is applied.

Example of a Configuration of an Electronic Apparatus Including a CMOS Image Sensor to which the Solid-State Imaging Device of the Present Invention is Applied FIG. 24 is a block diagram showing an example of a configuration of an imaging apparatus as an electronic apparatus which includes a CMOS image sensor to which the solid-state imaging device of the present invention is applied.

Referring to FIG. 24, an imaging apparatus 300 according to an embodiment of the present invention includes an optical system 301 including a lens group and so forth, a solid-state imaging device or imaging device 302 for which any of the configurations of the unit pixels 120 described hereinabove, and a DSP (Digital Signal Processor) circuit 303 which is a camera signal processing circuit. The image apparatus 300 further includes a frame memory 304, a display unit 305, a recording unit 306, an operating unit 307, and a power supply unit 308. The DSP circuit 303, frame memory 304, display unit 305, recording unit 306, operating unit 307 and power supply unit 308 are connected to each other by a bus line 309.

The optical system 301 fetches incident light or image light from an imaging object and forms an image on an imaging face of the solid-state imaging device 302. The solid-state imaging device 302 converts the amount of the incident light of the image formed on the imaging face thereof by the optical system 301 into electric signals and outputs the electric signals as pixel signals. As the solid-state imaging device 302, a solid-state imaging device such as any of the CMOS image sensors 100 according to the embodiments described hereinabove, or in other words, a solid-state imaging device which can implement pickup of an image free from distortion by global exposure, can be used.

The display unit 305 is formed from a panel type display apparatus such as a liquid crystal display, an organic EL (electroluminescence) display panel or the like and displays a moving picture or a still picture imaged by the solid-state imaging device 302. The recording apparatus 306 records the moving picture or the still picture imaged by the solid-state imaging device 302 on a recording medium such as a video tape or a DVD (Digital Versatile Disk).

The operation system 307 issues operation instructions regarding various functions which the imaging apparatus 300 has in response to an operation thereof by a user. The power supply system 308 suitably supplied various powers serving as operation power supplies for the DSP circuit 303, frame memory 304, display unit 305, recording unit 306 and operating unit 307 to the power supply objects.

By using the CMOS image sensor 100 according to the embodiments described hereinabove as the solid-state imaging device 302 as described above, it is possible to reduce noise arising from a threshold value dispersion of the pixel transistors and assure a high S/N ratio (signal-noise ratio). Accordingly, also in the case where the imaging apparatus 300 is applied to a camera module for a mobile apparatus such as a portable telephone set, high picture quality of a picked up image can be anticipated.

Further, in the embodiments described above, the present invention is applied to a CMOS image sensor wherein a plurality of unit pixels for detecting signal charge in response to a light amount of visible rays as a physical quantity are disposed in rows and columns. However, the application of the present invention is not limited to a CMOS image sensor, but the present invention can be applied generally to solid-state imaging devices of the column type wherein a column processing section is disposed for each pixel column of the pixel array section.

Further, the application of the present invention is not limited to a solid-state imaging device which detects a distribution of an incident light amount of visible rays and images the distribution. The present invention can be applied to solid-state imaging devices which image a distribution of an incident amount of infrared rays, X rays, particles or the like and also to general solid-state imaging devices, that is, to physical quantity distribution detection apparatus, such as fingerprint detection sensors for detecting a distribution of a different physical quantity in a wide sense such as pressure or capacitance.

It is to be noted that, in the present specification, the steps which describe the program recorded in or on a recording medium may be but need not necessarily be processed in a time series in the order as described, and include processes which are executed in parallel or individually without being processed in a time series.

Further, in the present specification, the term "system" is used to represent an entire apparatus composed of a plurality of devices or apparatus.

The present application contains subject matter related to that disclosed in Japanese Priority Patent Application JP 2010-080527 filed in the Japan Patent Office on Mar. 31, 2010, the entire content of which is hereby incorporated by reference.

While preferred embodiments of the present invention have been described using specific terms, such description is for illustrative purpose only, and it is to be understood that changes and variations may be made without departing from the spirit or scope of the following claims.

What is claimed is:

1. A solid-state imaging device, comprising:
a CMOS image sensor including a plurality of pixels disposed in an array and each including a light reception element adapted to receive light to generate charge as a reception light signal, a discharging unit adapted to discharge the charge as the reception light signal of said light reception element, a charge accumulation section adapted to accumulate the charge as the reception light signal of said light reception element transferred thereto, a transfer unit adapted to transfer the charge as the reception light signal to said charge accumulation section through a different route different from a route along which the charge as the reception light signal is discharged by said discharging unit, a reset unit adapted to release the charge accumulated in said charge accumulation section to reset said charge accumulation section, an amplification unit adapted to amplify and output the reception light signal accumulated in said charge accumulation section, and a selection unit adapted to select an output of said amplification unit; and
a control unit adapted to generate a selection pulse for rendering said selection unit operative to control operation of said CMOS image sensor;
charge as reception light signals accumulated in the light reception elements in a frame or frames preceding to a current frame being transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharge units, the reception light signals accumulated in the charge accumulation sections are amplified successively in a unit of a row by the amplification units and then read out;
the discharging of the charge as the reception light signals of the light reception elements by the discharging units being stopped, whereafter accumulation of charge as reception light signals by the light reception elements is started;
the charge accumulated in the charge accumulation sections being discharged, at a top of a current frame which is next to a frame with regard to which the reading out by said selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by said transfer unit;

the reception light signals accumulated in the charge accumulation sections being amplified and read out, in a state in which the charge accumulated in the light reception elements continues to be discharged simultaneously in a unit of a row by the discharging units again, successively in a unit of a row by the amplification units;

said control unit controlling, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

2. The solid-state imaging device according to claim 1, wherein said CMOS image sensor further includes a predetermined number of dummy rows which in turn include pixels which do not contribute to the image display, and said control unit controls so as to generate, when the reception light signals accumulated in the charge accumulation sections are successively amplified by the amplification units and read out by the selection units in a unit of a row, a selection pulse for causing the selection units of the pixels of the predetermined number of dummy rows which do not contribute to the image display from among the pixels to operate at a timing at which the discharging of the charge accumulated in the light reception elements by the discharging units is stopped.

3. The solid-state imaging device according to claim 1, wherein said control unit controls so as to generate, when the reception light signals accumulated in the charge accumulation sections are successively amplified by the amplification units and read out by the selection units in a unit of a row, a selection pulse for causing the selection units of those pixels in a row, with regard to which the reception light signals accumulated in the charge accumulation sections are amplified by the amplification units and read out already by the selection units, from among the pixels to operate at a timing at which the discharging of the charge accumulated in the light reception elements by the discharging units is stopped.

4. The solid-state imaging device according to claim 1, wherein each of said pixels of said CMOS image sensor further includes a different charge accumulation section different from the charge accumulation section and formed from a charge retaining region disposed between said light reception element and said charge accumulation section which is formed from a floating diffusion region.

5. The solid-state imaging device according to claim 1, further comprising:

a row unit image information storage unit adapted to successively store image signals at least for one row formed by amplification of the reception light signals by the amplification units and outputted by the selection units; and a selection unit adapted to decide whether or not the image signals for at least one row formed by amplification of the reception light signals by the amplification units and outputted by the selection units are image signals of those pixels in a row which does not contribute to the image display, select and output, when the image signals for one row outputted by the selection units are not image signals of the pixels in a row which does not contribute to the image display, image signals in one immediately preceding row stored in said row unit image information storage unit but select and output, when the image signals for one row outputted by the selection units are image signals of the pixels in a row which does not contribute to the image display, image signals for one immediately preceding row stored in said row unit image information storage unit, and select and output, with regard to a succeeding row, image signals for one row outputted by the selection units.

6. The solid-state imaging device according to claim 1, wherein said CMOS image sensor is configured such that one or plural ones of said charge accumulation section, transfer unit, reset unit, amplification unit and selection unit are commonly used by plural ones of said pixels.

7. The solid-state imaging device according to claim 1, further comprising a digital signal processor provided on a main body substrate.

8. A driving method for a solid-state imaging device which includes a CMOS image sensor including a plurality of pixels disposed in an array and each including a light reception element adapted to receive light to generate charge as a reception light signal, a discharging unit adapted to discharge the charge as the reception light signal of the light reception element, a charge accumulation section adapted to accumulate the charge as the reception light signal of the light reception element transferred thereto, a transfer unit adapted to transfer the charge as the reception light signal to the charge accumulation section through a different route different from a route along which the charge as the reception light signal is discharged by the discharging unit, a reset unit adapted to release the charge accumulated in the charge accumulation section to reset the charge accumulation section, an amplification unit adapted to amplify and output the reception light signal accumulated in the charge accumulation section, and a selection unit adapted to select an output of the amplification unit, and a control unit adapted to generate a selection pulse for rendering the selection unit operative to control operation of the CMOS image sensor, the driving method comprising:

a controlling step carried out by the control unit of generating a selection pulse for causing the selection means to operate to control operation of the selection unit;

charge as reception light signals accumulated in the light reception elements in a frame or frames preceding to a current frame being transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharge units, the reception light signals accumulated in the charge accumulation sections are amplified successively in a unit of a row by the amplification units and then read out;

the discharging of the charge as the reception light signals of the light reception elements by the discharging units being stopped, whereafter accumulation of charge as reception light signals by the light reception elements is started;

the charge accumulated in the charge accumulation sections being discharged, at a top of a current frame which is next to a frame with regard to which the reading out by the selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by said transfer unit;

the reception light signals accumulated in the charge accumulation sections being amplified and read out, in a state in which the charge accumulated in the light reception elements continues to be discharged simultaneously in a unit of a row by the discharging units again, successively in a unit of a row by the amplification units;

the processing at the controlling step controlling, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

9. The driving method for solid-state imaging device according to claim 8, wherein the CMOS image sensor further includes a predetermined number of dummy rows which in turn include pixels which do not contribute to the image display, and the processing at the controlling step controls so as to generate, when the reception light signals accumulated in the charge accumulation sections are successively amplified by the amplification units and read out by the selection units in a unit of a row, a selection pulse for causing the selection units of the pixels of the predetermined number of dummy rows which do not contribute to the image display from among the pixels to operate at a timing at which the discharging of the charge accumulated in the light reception elements by the discharging units is stopped.

10. The driving method for a solid-state imaging device according to claim 8, wherein the processing at the controlling step controls so as to generate, when the reception light signals accumulated in the charge accumulation sections are successively amplified by the amplification units and read out by the selection units in a unit of a row, a selection pulse for causing the selection units of those pixels in a row, with regard to which the reception light signals accumulated in the charge accumulation sections are amplified by the amplification units and read out already by the selection units, from among the pixels to operate at a timing at which the discharging of the charge accumulated in the light reception elements by the discharging units is stopped.

11. The driving method for a solid-state imaging device according to claim 8, wherein each of the pixels of the CMOS image sensor further includes a different charge accumulation section different from the charge accumulation section and formed from a charge retaining region disposed between the light reception element and the charge accumulation section which is formed from a floating diffusion region.

12. The driving method for a solid-state imaging device according to claim 8, wherein the solid-state imaging device further includes:

a row unit image information storage unit adapted to successively store image signals at least for one row formed by amplification of the reception light signals by the amplification units and outputted by the selection units; and a selection unit adapted to decide whether or not the image signals for at least one row formed by amplification of the reception light signals by the amplification units and outputted by the selection units are image signals of those pixels in a row which does not contribute to the image display, select and output, when the image signals for one row outputted by the selection units are not image signals of the pixels in a row which does not contribute to the image display, image signals in one immediately preceding row stored in the row unit image information storage unit but select and output, when the image signals for one row outputted by the selection units are image signals of the pixels in a row which does not contribute to the image display, image signals for one immediately preceding row stored in the row unit image information storage unit, and select and output, with regard to a succeeding row, image signals for one row outputted by the selection units.

13. The driving method for a solid-state imaging device according to claim 8, wherein the CMOS image sensor is configured such that one or plural ones of the charge accumulation section, transfer unit, reset unit, amplification unit and selection unit are commonly used by plural ones of the pixels.

14. The driving method for a solid-state imaging device according to claim 8, wherein the solid-state imaging device further includes a digital signal processor provided on a main body substrate.

15. An electronic apparatus, comprising:

a CMOS image sensor including a plurality of pixels disposed in an array and each including a light reception element adapted to receive light to generate charge as a reception light signal, a discharging unit adapted to discharge the charge as the reception light signal of said light reception element, a charge accumulation section adapted to accumulate the charge as the reception light signal of said light reception element transferred thereto, a transfer unit adapted to transfer the charge as the reception light signal to said charge accumulation section through a different route different from a route along which the charge as the reception light signal is discharged by said discharging unit, a reset unit adapted to release the charge accumulated in said charge accumulation section to reset said charge accumulation section, an amplification unit adapted to amplify and output the reception light signal accumulated in said charge accumulation section, and a selection unit adapted to select an output of said amplification unit; and a control unit adapted to generate a selection pulse for rendering said selection unit operative to control operation of said CMOS image sensor;

charge as reception light signals accumulated in the light reception elements in a frame or frames preceding to a current frame being transferred simultaneously to the charge accumulation sections, whereafter the charge as the reception light signals is retained into the charge accumulation sections and then, in a state in which the charge accumulated in the light reception elements continues to be discharged simultaneously in a unit of a row by operation of the discharge units, the reception light signals accumulated in the charge accumulation sections are amplified successively in a unit of a row by the amplification units and then read out;

the discharging of the charge as the reception light signals of the light reception elements by the discharging units being stopped, whereafter accumulation of charge as reception light signals by the light reception elements is started;

the charge accumulated in the charge accumulation sections being discharged, at a top of a current frame which is next to a frame with regard to which the reading out by said selection units comes to end, simultaneously by the resetting units to reset the charge accumulation sections, whereafter the charge as the reception light signals accumulated in the light reception elements is transferred to and accumulated into the charge accumulation sections simultaneously in a unit of a row by said transfer unit;

the reception light signals accumulated in the charge accumulation sections being amplified and read out, in a state in which the charge accumulated in the light reception elements continues to be discharged simultaneously in a unit of a row by the discharging units again, successively in a unit of a row by the amplification units;

said control unit controlling, in a case where the series of operations is repeated, so as to generate, when the reception light signals accumulated in the charge accumulation sections are successively amplified by the amplification units and read out by the selection units in a unit of a row, a selection pulse for causing the selection units of those pixels in a predetermined number of rows which do not contribute to image display from among the pixels to operate at a timing at which the discharging of the charge accumulated in the light reception elements by the discharging units is stopped.

* * * * *